(12) United States Patent
Furuhashi et al.

(10) Patent No.: US 8,778,793 B2
(45) Date of Patent: Jul. 15, 2014

(54) SEMICONDUCTOR DEVICE AND METHOD OF MANUFACTURING THE SAME

(75) Inventors: Takahisa Furuhashi, Kanagawa (JP); Naohito Suzumura, Kanagawa (JP)

(73) Assignee: Renesas Electronics Corporation, Kawsaki-Shi, Kanagawa (JP)

( * ) Notice: Subject to any disclaimer, the term of this patent is extended or adjusted under 35 U.S.C. 154(b) by 132 days.

(21) Appl. No.: 13/370,000

(22) Filed: Feb. 9, 2012

(65) Prior Publication Data

US 2012/0228774 A1  Sep. 13, 2012

(30) Foreign Application Priority Data

Mar. 10, 2011 (JP) .................................. 2011-053007

(51) Int. Cl.
*H01L 21/768* (2006.01)
*H01L 23/485* (2006.01)
*H01L 23/532* (2006.01)

(52) U.S. Cl.
USPC ........... 438/624; 438/629; 438/633; 438/639; 438/640; 438/786; 438/680; 438/687; 257/760

(58) Field of Classification Search
USPC .......................... 257/762; 438/629, 680, 692
See application file for complete search history.

(56) References Cited

U.S. PATENT DOCUMENTS

| | | | |
|---|---|---|---|
| 6,908,847 B2* | 6/2005 | Saito et al. ..................... | 438/627 |
| 7,217,654 B2* | 5/2007 | Nagahara et al. ............. | 438/637 |
| 2001/0002331 A1* | 5/2001 | Miyata .......................... | 438/618 |
| 2006/0175705 A1* | 8/2006 | Tsutsue et al. ................ | 257/758 |
| 2006/0286816 A1* | 12/2006 | Aoi et al. ...................... | 438/790 |

FOREIGN PATENT DOCUMENTS

| | | |
|---|---|---|
| JP | 2006-073569 | 3/2006 |
| JP | 2006073569 A * | 3/2006 |
| WO | WO 2010/125682 A1 | 11/2010 |

\* cited by examiner

*Primary Examiner* — Olik Chaudhuri
*Assistant Examiner* — Nicholas Tobergte
(74) *Attorney, Agent, or Firm* — McDermott Will & Emery LLP

(57) ABSTRACT

A barrier insulating film is constituted from a first SiCN film formed with a tetramethylsilane gas flow rate lower than usual, a second SiCN film formed over the first SiCN film and formed with a usual tetramethylsilane gas flow rate, and a SiCO film formed over the second SiCN film.

7 Claims, 27 Drawing Sheets

|  | CONVENTIONAL | 4MS ↓ | 4MS ↓ ↓ |
|---|---|---|---|
| 4MS FLOW RATE | 1 | 0.82 | 0.64 |
| Si-CH$_3$ / SiC (%) | 0.33 | 0.28 | 0.25 |

SEMICONDUCTOR DEVICE AND METHOD OF MANUFACTURING THE SAME

CROSS-REFERENCE TO RELATED APPLICATION

The disclosure of Japanese Patent Application No. 2011-53007 filed on Mar. 10, 2011 including the specification, drawings and abstract is incorporated herein by reference in its entirety.

BACKGROUND

The present invention relates to a semiconductor device and a technique of manufacturing it, in particular, to a technique useful when applied to manufacture a semiconductor device having copper wiring and a semiconductor device having wiring formed by using a damascene process.

Japanese Patent Laid-Open No. 2006-73569 (Patent Document 1) describes a technique of forming a SiCN film having a low Si—$CH_3$ composition ratio over a SiCN film having a high Si—$CH_3$ composition ratio by adjusting the flow rate ratio of trimethylsilane gas and helium gas. The document says that this technique makes it possible to suppress resist poisoning.

International Patent Publication No. WO2010/125682 (Patent Document 2) describes a technique of forming a SiCN film over copper wiring, and, over the SiCN film, forming a SiCO film. The document states that, at that time, the SiCN film is a copper diffusion prevention film having a function of preventing the diffusion of copper from the copper wiring, and that the SiCO film is a film of preventing the diffusion of amine generated in the SiCN film to thereby suppress the resist poisoning.

SUMMARY

Over a semiconductor substrate constituting a semiconductor chip, a metal insulator semiconductor field effect transistor (MISFET) is formed, and, over the MISFET, multilayer wiring is formed. In recent years, to realize a high integration of a semiconductor chip, miniaturization of multilayer wiring has been promoted. Consequently, increase in resistance and increase in parasitic capacitance caused by the reduction of the interval between wirings due to the miniaturization of the wiring have been revealed as problems. Through the multilayer wiring, electric signals flow, and, caused by the increase in resistance of wiring and the increase in the parasitic capacitance between wirings, delay of the electric signal occurs. In a circuit for which timing is important, the delay of the electric signal flowing through the wiring causes a malfunction and the circuit may not function as a normal circuit. Judging from this, the control of increase in resistance of wiring and the reduction of the parasitic capacitance between wirings are necessary to prevent the delay of electric signals flowing through the wiring.

In recent years, the material constituting the multilayer wiring has been changed from an aluminum film to a copper film. Because the copper film has a resistivity lower than that of an aluminum film, even when the wiring is miniaturized, increase in resistance of the wiring can be controlled. Furthermore, from the viewpoint of reducing the parasitic capacitance between wirings, a part of an interlayer insulating film lying between wirings has been constituted by a low permittivity film having a low permittivity. As described above, in semiconductor devices having multilayer wiring, to achieve high performance, a copper film is used as the material of the wiring, and a low permittivity film is used for a part of an interlayer insulating film.

When a copper wiring is used as the wiring, usually, a copper diffusion prevention film for preventing the diffusion of copper is formed over the copper wiring. The copper diffusion prevention film is formed from a SiCN film.

With the downsizing of semiconductor devices in recent years, the miniaturization of the wiring also has been proceeding. However, with the miniaturization of the wiring, a problem which electromigration resistance of the copper wiring deteriorates has occurred. The inventor examined the cause, and found that it was the thinning of the SICN film being the copper diffusion prevention film. With the miniaturization of the copper wiring, the thinning of the SICN film being the copper diffusion prevention film also progresses, but, when the thinning of the SICN film progresses, the water penetration resistance of the SiCN film lowers. When the water penetration resistance of the SiCN film lowers, because moisture reaches the copper wiring through the SiCN film, the moisture oxidizes the copper wiring. Then, the adherence between the SiCN film and the copper wiring lowers. When the adherence between the SiCN film and the copper wiring is high, the SiCN film fixes the copper constituting the copper wiring to control the electromigration due to the movement of the copper. But, when the copper is oxidized and the adherence between the SiCN film and the copper wiring lowers, the fixation of the copper by the SiCN film is apt to be difficult, the copper is apt to move easily, and then the electromigration resistance lowers.

Furthermore, when the water penetration resistance of the SiCN film lowers due to the thinning of the SICN film, moisture reaches the copper wiring through the SiCN film and then the copper constituting the copper wiring ionizes. And, there is also a problem which the ionized copper moves into the interlayer insulating film, and thus inter-wire time dependent dielectric breakdown (TTB) of the interlayer insulating film lowers.

The present invention has been made in view of the above circumstances and achieves the improvement of the reliability of wiring constituting a semiconductor device.

The other purposes and the new feature of the present invention will become clear from the description of the present specification and the accompanying drawings.

The following explains briefly the outline of a typical invention among the inventions disclosed in the present application.

A semiconductor device in a representative embodiment includes (a) semiconductor substrate, (b) an interlayer insulating film formed over the semiconductor substrate, (c) wiring formed to be embedded in the interlayer insulating film, and (d) a first SiCN film formed over the interlayer insulating film for which the wiring is formed. And, the semiconductor device includes (e) a second SiCN film formed over the first SiCN film, (f) a first insulating film formed over the second SiCN film, and (g) a prescribed wiring layer formed over the first insulating film by a prescribed interlayer insulating film and a prescribed wiring formed in the prescribed interlayer insulating film. The first insulating film includes a silicon oxide (SiCO) film, and the interlayer insulating film and the prescribed interlayer insulating film have a low permittivity. Furthermore, the semiconductor device is characterized in that the content of a methyl group contained in the first SiCN film differs from that of a methyl group contained in the second SiCN film.

Moreover, a semiconductor device in a representative embodiment includes (a) a semiconductor substrate, (b) an interlayer insulating film formed over the semiconductor substrate, (c) wiring formed to be embedded in the interlayer insulating film, and (d) a SiCN film formed over the interlayer insulating film for which the wiring is formed. And, the semiconductor device includes (e) a first insulating film formed over the SiCN film, and (f) a prescribed wiring layer formed over the first insulating film by a prescribed interlayer insulating film and a prescribed wiring formed in the prescribed interlayer insulating film. The first insulating film includes a silicon oxide (SiCO) film, and the interlayer insulating film and the prescribed interlayer insulating film have a low permittivity. Furthermore, the semiconductor device is characterized in that the content of a methyl group differs in the thickness direction of the SiCN film.

In addition, a method of manufacturing a semiconductor device in a representative embodiment includes the steps of (a) forming a first interlayer insulating film over a semiconductor substrate, and (b) after the step (a), forming a first wiring trench for the first interlayer insulating film. And, the method includes steps of (c) after the step (b), forming a first wiring for the first wiring trench, and (d) after the step (c), forming a first SiCN film over the first interlayer insulating film for which the first wiring is formed by a CVD method using a first source gas containing a methyl group. Furthermore, the method includes the steps of (e) after the step (d), forming a second SiCN film over the first SiCN film by a CVD method using the first source gas containing a methyl group, and (f) after the step (e), forming a first insulating film including a silicon oxide (SiCO) film over the second SiCN film. The method includes, after that, the step of (g) after the step (f), forming a wiring layer including a second interlayer insulating film and a second wiring formed in the second interlayer insulating film over the first insulating film. The semiconductor device is characterized in that the first interlayer insulating film and the second interlayer insulating film have a low permittivity, and that the flow rate of the first source gas used in the step (d) differs from that of the first source gas used in the step (e).

The following explains briefly the effect acquired by the typical invention among the inventions disclosed in the present application.

The reliability of wiring constituting a semiconductor device can be improved.

DETAILED DESCRIPTION

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements (including the number, a numeric value, an amount, and a range), they may be not restricted to the specific number but may be greater or smaller than the specific number, except for the case where they are clearly specified in particular and where they are clearly restricted to a specific number theoretically.

Furthermore, in the following embodiments, a constituent element (including an element step) is not necessarily indispensable, except for the case where it is clearly specified in particular and where it is considered to be clearly indispensable from a theoretical point of view.

Similarly, in the following embodiments, when shape and position relationship of a constituent element are referred to, what resembles or is similar substantially to the shape shall be included, except for the case where it is clearly specified in particular and where it is considered to be clearly not right from a theoretical point of view. This statement also applies to the numeric value and range described above.

In all the drawings for explaining embodiments, the same symbol is attached to the same member, as a principle, and the repeated explanation is omitted. To make a drawing intelligible, hatching may be attached even if it is a plan view.

Embodiment 1

<Examination of Problems>

Figure 1:
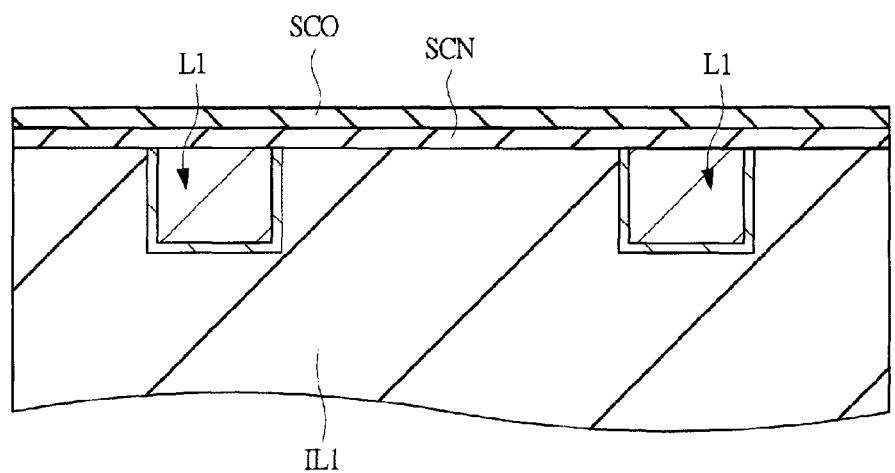
FIG. 1 is a cross-sectional view showing a part of a wiring structure examined by the inventor.

When copper wiring is used as wiring, usually, a copper diffusion prevention film for preventing the diffusion of copper is formed over the copper wiring. The copper diffusion prevention film is formed from a SiCN film. Furthermore, over the SiCN film, a SiCO film for suppressing resist poisoning to be described later is formed. Specifically, FIG. 1 is a cross-sectional view showing a part of a wiring structure examined by the inventor. As shown in FIG. 1, a first layer wiring L1 including copper wiring is formed to be embedded in an interlayer insulating film IL1 formed over a semiconductor substrate. Over an upper part of the first layer wiring L1, a SiCN film SCN is formed as the copper diffusion prevention film. Over the SiCN film SCN, a SiCO film SCO is formed.

With the downsizing of semiconductor devices in recent years, the miniaturization of wiring has also been progressing. With the miniaturization of wiring, a problem of deteriorating electromigration resistance of copper wiring (a first layer wiring L1 in FIG. 1) has occurred.

Figure 2:
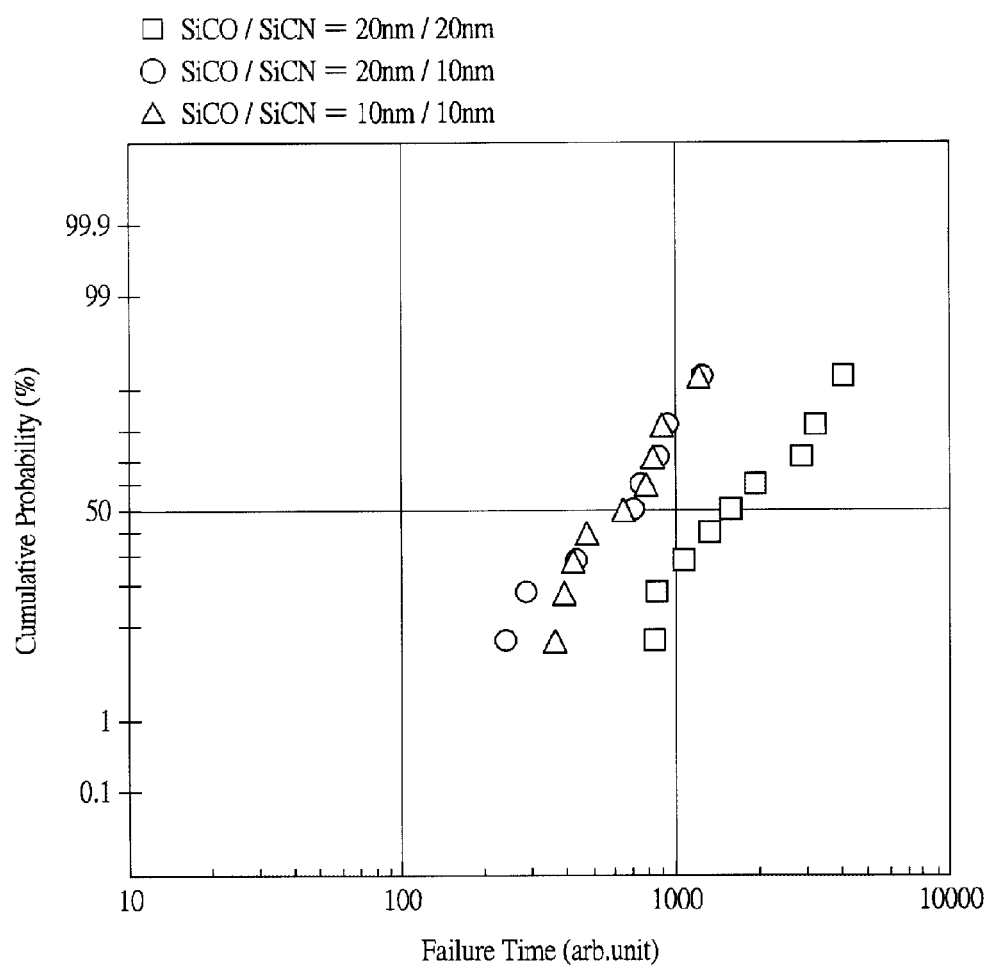
FIG. 2 is a graph showing the relation between thicknesses of a SiCN film and a SiCO film, and electromigration properties in copper wiring.

Specifically, FIG. 2 is a graph showing the relation between thicknesses of a SiCN film and a SiCO film, and electromigration properties in copper wiring. In FIG. 2, the symbol □ shows the case where the SiCO film and the SiCN film have a thickness of 20 nm, the symbol ○ shows the case where the SiCO film has a thickness of 20 nm and the SiCN film has a thickness of 10 nm. The symbol Δ shows the case where the SiCO film and the SiCN film have a thickness of 10 nm.

In FIG. 2, the horizontal axis shows failure time (an arbitrary unit), and the failure time shows time until the change of the resistance of copper wiring exceeds a threshold value when a constant current is flown through the copper wiring in a constant direction. When a constant current is continuously flown to copper wiring in a constant direction, electromigration occurs and then a phenomenon in which the resistance rises rapidly by the electromigration occurs. Consequently, by detecting a state where the resistance rises rapidly, the deterioration by the electromigration in the copper wiring is determined. The failure time in FIG. 2 shows the time until the electromigration qualitatively occurs, and a longer failure time shows that electromigration properties of the copper wiring are better. A shorter failure time shows that electromigration properties of the copper wiring are apt to deteriorate.

The vertical axis in FIG. 2 shows cumulative probability. This vertical axis shows the cumulative probability on the assumption that the test object follows the normal distribution. The important point in the vertical axis is the failure time at the center of the normal distribution (50%) where the probability is high.

As shown in FIG. 2, in viewing the failure time at the position where the cumulative probability of the vertical axis is 50%, the case where the thickness of the SiCO film and the SiCN film is 20 nm (the symbol □) provides the longest failure time and good electromigration properties. In contrast, cases where the thickness of the SiCO film is 20 nm and that of the SiCN film is 10 nm (the symbol ○), and the thickness of the SiCO film and the SiCN film is 10 nm (the symbol Δ) provide failure times shorter than the failure time of the case where the thickness of the SiCO film and the SiCN film is 20 nm (the symbol □) and equivalent to each other. Accordingly, the failure time depends largely on the thickness of the SiCN film rather than that of the SiCO film, and that it becomes shorter rapidly when the SiCN film is thinned from 20 nm to 10 nm. The electromigration properties depend largely on the thickness of the SiCN film being the copper diffusion prevention film.

<Knowledge Generated by Examining Problems>

Consequently, the inventor has examined why the electromigration properties deteriorate when the SiCN film becomes thin. The inventor has considered that the cause of the deterioration of the electromigration properties of copper wiring is the lowering of the water penetration resistance of the SiCN film with the progress of the thinning of the SICN film. When the SiCN film is thinned, the water penetration resistance of the SiCN film lowers. When the water penetration resistance of the SiCN film lowers, moisture reaches the copper wiring through the SiCN film and oxidizes the copper wiring. Then, the adherence between the SiCN film and the copper wiring lowers. When the adherence between the SiCN film and the copper wiring is high, the SiCN film fixes copper constituting the copper wiring to control the electromigration caused by the movement of the copper. The inventor has considered that, in contrast, when the copper is oxidized to lower the adherence between the SiCN film and the copper wiring, the copper tends to hardly be fixed by the SiCN film and is apt to move easily, which deteriorates the electromigration properties. Accordingly, even when the SiCN film is thinned, if the water penetration resistance of the SiCN film can be maintained or improved, the deterioration of the electromigration properties of the copper wiring can be controlled.

Consequently, as the result of examining the means for solving the above-mentioned problem, the inventor has obtained the knowledge shown below. The SiCN film is formed by a CVD (Chemical Vapor Deposition) using tetramethylsilane gas (4MS) and ammonia gas (NH$_3$) as source gases. On this occasion, according to the examination by the inventor that, when a SiCN film is formed in a state where the flow rate of the tetramethylsilane gas (4MS) is lower than usual, the water penetration resistance of the SiCN film is improved. It is supposed that the reason is because, when a SiCN film is formed in a state where the flow rate of the tetramethylsilane gas (4MS) is lower than usual, a methyl group (CH$_3$) contained in the SiCN film is reduced and then the SiCN film is densified. When the flow rate of the tetramethylsilane gas (4MS) is lower than usual, a methyl group (CH$_3$) contained in the SiCN film to be formed is reduced. And, it can be considered that, when the methyl group (CH$_3$) contained in the SiCN film is reduced, the SiCN film is densified and then the water penetration resistance of the SiCN film is improved. The inventor has considered that, accordingly, the use of the SiCN film formed in a state where the flow rate of the tetramethylsilane gas (4MS) is lowered as the copper diffusion prevention film can improve the water penetration resistance of the SiCN film, and that, as the result, even when the SiCN film is thinned, the electromigration properties of the copper wiring can be improved.

Figure 3:
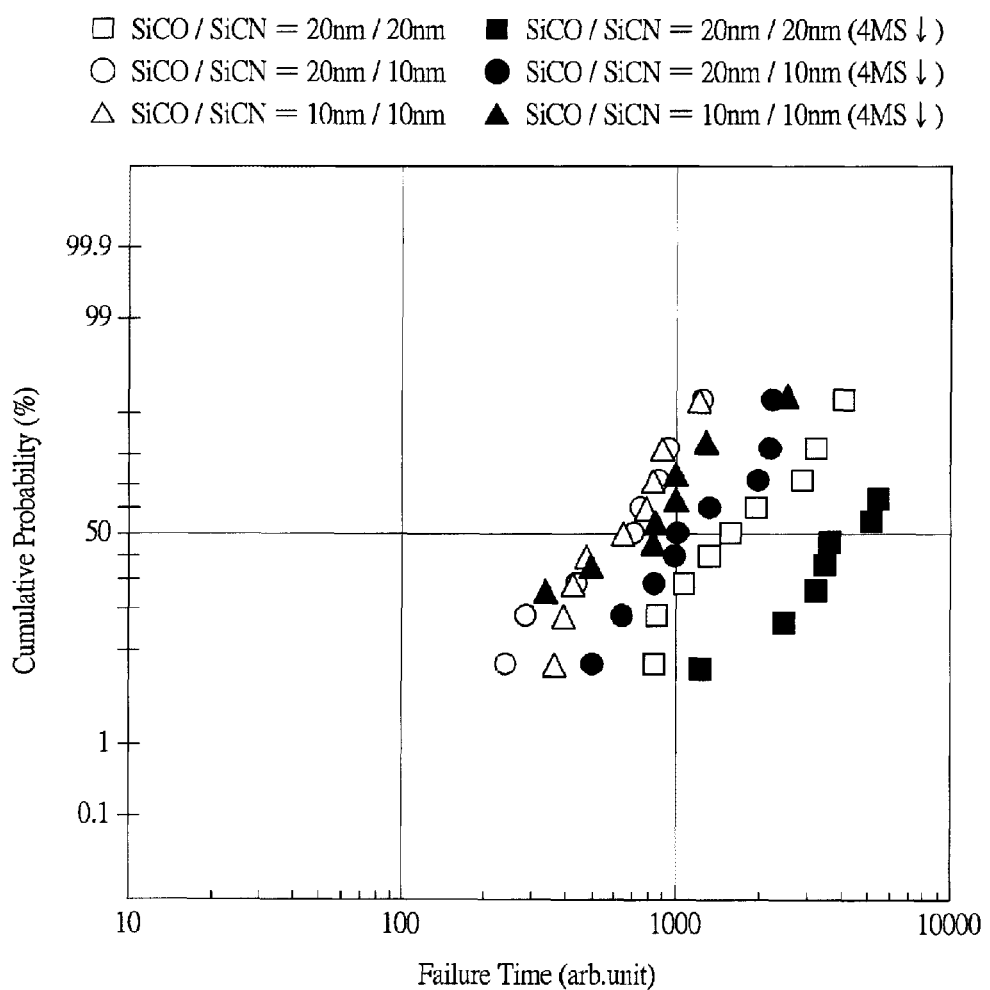
FIG. 3 is a graph showing measurement results of electromigration properties in a SiCN film formed using tetramethylsilane gas (4MS) under a usual condition, and a SiCN film formed using tetramethylsilane gas (4MS) under a condition of a flow rate lower than usual, with the thickness changed.

Specifically, FIG. 3 is a graph showing measurement results of electromigration properties in a SiCN film formed using tetramethylsilane gas (4MS) under a usual condition, and a SiCN film formed using tetramethylsilane gas (4MS) under a condition of a flow rate lower than usual, with the thickness changed.

In FIG. 3, the symbol □ shows a case where a SiCN film is formed with a usual tetramethylsilane gas (4MS) flow rate, and the thickness of a SiCO film and the SiCN film is 20 nm. The symbol ○ shows a case where a SiCN film is formed with a usual tetramethylsilane gas (4MS) flow rate, and the thickness of a SiCO film is 20 nm and that of the SiCN film is 10 nm. The symbol Δ shows a case where a SiCN film is formed with a usual tetramethylsilane gas (4MS) flow rate, and the thickness of a SiCO film and the SiCN film is 10 nm.

Similarly, the symbol ■ shows a case where a SiCN film is formed under a condition with a tetramethylsilane gas (4MS) flow rate lower than that in a usual case, and the thickness of a SiCO film is 20 nm and the thickness of the SiCN film is 20 nm. The symbol ● shows a case where a SiCN film is formed under a condition with a tetramethylsilane gas (4MS) flow rate lower than usual, and the thickness of a SiCO film is 20 nm and that of the SiCN film is 10 nm. And, the symbol ▲ shows a case where a SiCN film is formed under a condition with a tetramethylsilane gas (4MS) flow rate lower than usual, and the thickness of a SiCO film and the SiCN film is 10 nm.

The horizontal axis in FIG. 3 shows the failure time (an arbitrary unit), and the vertical axis in FIG. 3 shows the cumulative probability. In FIG. 3, the failure time is viewed at the position where the cumulative probability is 50% on the vertical axis. First, in the case where the thickness of the SiCO film and the SiCN film is 20 nm, when comparing the case where the SiCN film is formed with a usual tetramethylsilane gas (4MS) flow rate (symbol □) with the case where the SiCN film is formed under a condition of a tetramethylsilane gas (4MS) flow rate lower than usual (symbol ■), the case of the symbol ■ has a longer failure time than the case of the symbol □. Similarly, in the case where the thickness of the SiCO film is 20 nm and that of the SiCN film is 10 nm, when comparing the case where the SiCN film is formed with a usual tetramethylsilane gas (4MS) flow rate (the symbol ○) with the case where the SiCN film is formed under a condition of a tetramethylsilane gas (4MS) flow rate lower than usual (the symbol ●), the case of the symbol ● has longer failure time than the case of the symbol ○. Furthermore, in the case where the thickness of the SiCO film is 10 nm and the thickness of the SiCN film is 10 nm, when comparing the case where the SiCN film is formed with an ordinary tetramethylsilane gas (4MS) flow rate (the symbol Δ) with the case where the SiCN film is formed under a condition of a tetramethylsilane gas (4MS) flow rate lower than that in an ordinary case (the symbol ▲), the case of the symbol ▲ has a longer failure time than the case of the symbol Δ. When comparing the case where the thickness of the SiCO film and the SiCN film are equivalent, the case where the SiCN film is formed under a condition of a lowered tetramethylsilane gas (4MS) flow rate can improve the electromigration properties than the case where the SiCN film is formed with a usual tetramethylsilane gas (4MS) flow rate.

The validity of such knowledge is proved also from the result shown in FIG. 3 that the formation of a SiCN film under a condition of a tetramethylsilane gas (4MS) flow rate 1 lower than usual reduces a methyl group (CH$_3$) contained in the SiCN film to densify the SiCN film and, as a result, to improve the water penetration resistance of the SiCN film and then to improve the electromigration properties of the copper wiring.

Furthermore, the SiCN film formed under a condition of a tetramethylsilane gas (4MS) flow rate lower than usual can give such advantage as capable of improving the inter-wire time dependent dielectric breakdown (TDDB). When the water penetration resistance of a SiCN film lowers, moisture reaches the copper wiring through the SiCN film, and thus the moisture ionizes the copper constituting the copper wiring. Subsequently, the ionized copper moves into the interlayer insulating film and then the inter-wire TDDB of the interlayer insulating film lowers. Accordingly, using a SiCN film formed under a condition of a tetramethylsilane gas (4MS) flow rate lower than usual improves the water penetration resistance of the SiCN film. As a result, the arrival of moisture to the copper wiring through the SiCN film is controlled. Consequently, the ionization of the copper by moisture is controlled, and, as a result, the deterioration of the inter-wire TDDB caused by the diffusion of copper ions into the interlayer insulating film can also be controlled.

The knowledge at which the inventor arrived by examining the problem is that the formation of a SiCN film under a condition of a tetramethylsilane gas (4MS) flow rate lower than usual can improve the water penetration resistance of the SiCN film. The knowledge was found out from the viewpoint of controlling the deterioration of the electromigration properties of the copper wiring, as the result of the lowering of the adherence between the SiCN film and the copper wiring because of the oxidation of copper by moisture reaching the copper wiring through the SiCN film, and, at the same time, the improvement of the water penetration resistance of the SiCN film can control the ionization of copper by moisture reaching the copper wiring through the SiCN film to allow the deterioration of inter-wire TDDB properties due to the diffusion of copper into the interlayer insulating film, to be also controlled. The improvement of the water penetration resistance of the SiCN film is profitable not only from the viewpoint of the improvement of the electromigration properties of the copper wiring but also from that of the improvement of the inter-wire TDDB properties.

Figure 4:
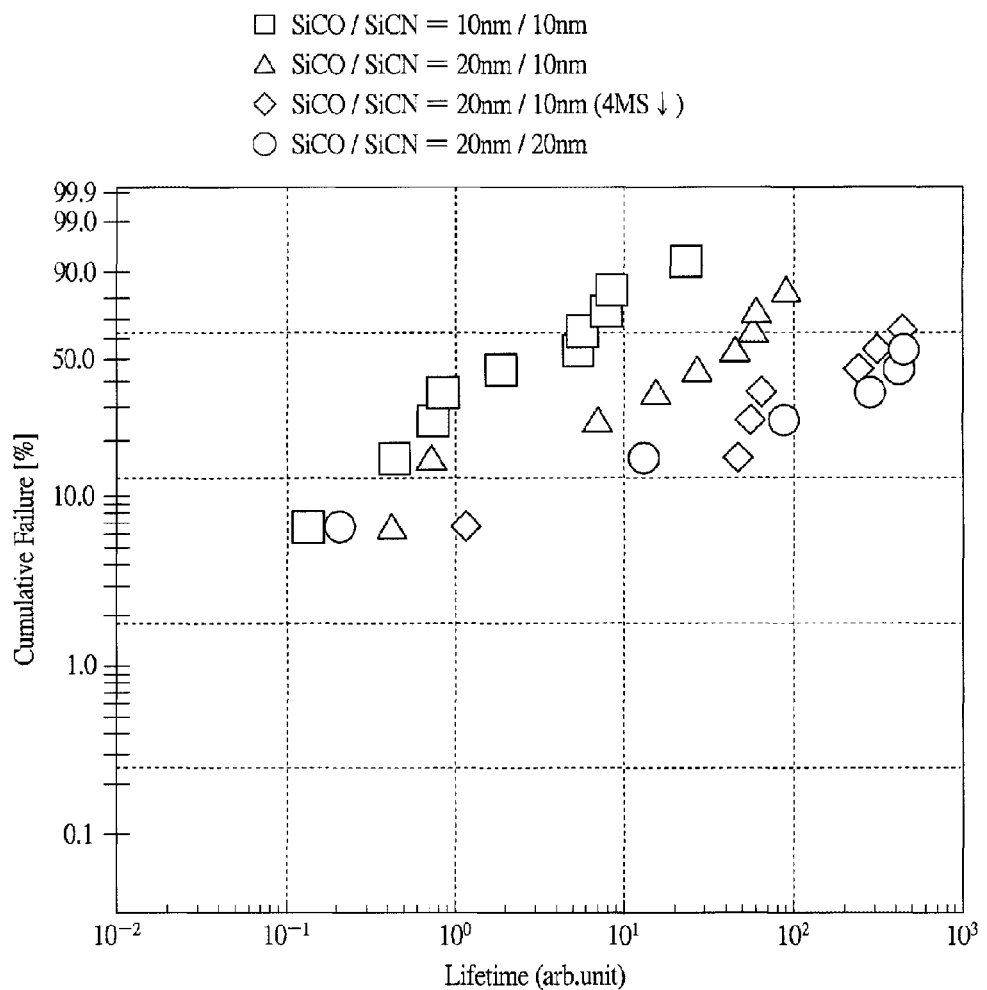
FIG. 4 is a graph showing measurement results of interwire TDDB properties in a SiCN film formed using tetramethylsilane gas (4MS) under a usual condition, and a SiCN film formed using tetramethylsilane gas (4MS) under a condition of a flow rate lower than usual, with the thickness changed.

Specifically, FIG. 4 is a graph showing measurement results of inter-wire TDDB properties in a SiCN film formed by using tetramethylsilane gas (4MS) under a usual condition, and a SiCN film formed under a condition of a flow rate of tetramethylsilane gas (4MS) lower than usual, with the thickness changed.

In FIG. 4, the symbol □ shows the case where a SiCN film is formed with a usual tetramethylsilane gas (4MS) flow rate, and the thickness of the SiCO film and the SiCN film is 10 nm. The symbol Δ shows the case where a SiCN film is formed with a usual tetramethylsilane gas (4MS) flow rate, and the thickness of the SiCO film is 20 nm and that of the SiCN film is 10 nm. The symbol ◇ shows the case where a SiCN film is formed under a condition of a tetramethylsilane gas (4MS) flow rate lower than that usual, and the thickness of the SiCO film is 20 nm and that of the SiCN film is 10 nm.

Similarly, the symbol ○ shows the case where a SiCN film is formed with a usual tetramethylsilane gas (4MS) flow rate, and the thickness of the SiCO film and the SiCN film is 20 nm.

The horizontal axis in FIG. 4 shows lifetime (an arbitrary unit), and the vertical axis in FIG. 4 shows cumulative failure. The lifetime shown on the horizontal axis in FIG. 4 shows a time until a leak current flowing through the interlayer insulating film existing between plural copper wirings exceeds a certain threshold value, and is an indicator showing inter-wire TDDB properties of the interlayer insulating film. A longer lifetime provides a continued state where the leak current flowing through the interlayer insulating film is less, which means better inter-wire TDDB properties of the interlayer insulating film. A shorter lifetime means an easier deterioration of the inter-wire TDDB properties of the interlayer insulating film. And, the cumulative failure shown on the vertical axis in FIG. 4 shows the cumulative probability on the assumption that the test object follows the Weibull distribution. The important point of the vertical axis is the lifetime at the center of the probability distribution with a high probability (63.2%).

View the lifetime at the position where the cumulative probability is 63.2% on the vertical axis in FIG. 4. First, the lifetime is longest in the case where the thickness of the SiCO film and the SiCN film is 20 nm, and the SiCN film is formed with a usual tetramethylsilane gas (4MS) flow rate (the symbol ○). It is considered that this is because these two films are as thick as 20 nm and have excellent water penetration resistance.

Second, in the case where the thickness of the SiCO film and the SiCN film is 10 nm, the lifetime is shortest when the SiCN film is formed with a usual tetramethylsilane gas (4MS) flow rate (the symbol □). It can be considered that this is because the thickness of these two films is 10 nm and the water penetration resistance of the SiCN film has deteriorated.

Next, in the case where the thickness of the SiCO film is 20 nm and that of the SiCN film is 10 nm, the lifetime lies between the case of the symbol ○ and the case of the symbol □ when the SiCN film is formed with a usual tetramethylsilane gas (4MS) flow rate (the symbol Δ). It is considered that this is because the thickness in the case of the symbol Δ (20 nm/10 nm) lies halfway between the thickness in the case of the symbol ○ (20 nm/20 nm) and that in the case of the symbol □ (10 nm/10 nm).

In contrast, in the case where the thickness of the SiCO film is 20 nm and that of the SiCN film is 10 nm, the lifetime has become long to the same extent as that in the case of the symbol ○ when the SiCN film is formed under a condition of a tetramethylsilane gas (4MS) flow rate lower than usual (the symbol ◇). This means that, as compared with a SiCN film formed with a usual tetramethylsilane gas (4MS) flow rate, the SiCN film formed under a condition of a tetramethylsilane gas (4MS) flow rate lower than usual can keep a comparable inter-wire TDDB with a half thickness.

From this, the result shown in FIG. 4 also supports the validity of such knowledge that the formation of a SiCN film under a condition of a tetramethylsilane gas (4MS) flow rate lower than usual reduces a methyl group ($CH_3$) contained in the SiCN film, densifies the SiCN film, and then allows the water penetration resistance of the SiCN film to be improved and inter-wire TDDB properties of the interlayer insulating film to be improved.

As described above, it has become clear that the SiCN film formed under a condition of a tetramethylsilane gas (4MS) flow rate lower than usual has a property excellent in the water penetration resistance, and the inventor has examined how the superiority of the water penetration resistance in SiCN films formed under a condition of a tetramethylsilane gas (4MS) flow rate lower than usual changes depending on the film thickness, or any film thickness can keep the superiority.

Figures 5, 6:
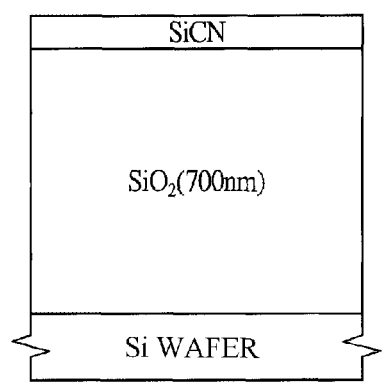
FIG. 5 is a schematic view showing an experiment for checking water penetration resistance of a SiCN film.
FIG. 6 is a table showing relative values of the flow rate of tetramethylsilane gas.

FIG. 5 is a schematic view showing an experiment for checking water penetration resistance of a SiCN film. As shown in FIG. 5, a silicon oxide film (a $SiO_2$ film) having a thickness of about 700 nm is formed over a Si wafer, and a SiCN film is formed over the silicon oxide film. In such structure, with a lapse of time, moisture passes through the SiCN and reaches the silicon oxide film. Then, residual stress residing in the silicon oxide film changes because of the influence of the moisture. Accordingly, by checking the change in the residual stress of the silicon oxide film, the water penetration resistance of the SiCN film can be evaluated. When the water penetration resistance of the SiCN film is high, moisture reaching the silicon oxide film decreases and the change in the residual stress of the silicon oxide film becomes small. In contrast, when the water penetration resistance of the SiCN film is low, moisture reaching the silicon oxide film increases and the change in the residual stress of the silicon oxide film becomes large. As described above, the water penetration resistance of the SiCN film can be grasped by measuring the change of the residual stress of the silicon oxide film with the lapse of time.

The following explains evaluation results of the water penetration resistance using the method shown in FIG. 5, as for SiCN films formed with the tetramethylsilane gas (4MS) flow rate changed. FIG. 6 shows that, when the tetramethylsilane gas (4MS) flow rate used under a usual forming condition is defined as 1, a lowered tetramethylsilane gas flow rate (4MS↓) is 0.82 and a further lowered tetramethylsilane gas flow rate (4MS↓↓) is 0.64. FIG. 6 shows that, on this occasion, the ratio of a Si—$CH_3$ bond and a Si—C bond contained in the SiCN film formed with the usual flow rate of tetramethylsilane gas (4MS) is 0.33, and that the ratio of a Si—$CH_3$ bond and a Si—C bond contained in the SiCN film formed by the tetramethylsilane gas with a lowered flow rate (4MS↓) is 0.28. In addition, FIG. 6 shows that the ratio of a Si—$CH_3$ bond and a Si—C bond contained in the SiCN film formed by the tetramethylsilane gas with a further lowered flow rate (4MS↓↓) is 0.25.

Below, as for a SiCN film formed with a usual flow rate of a tetramethylsilane gas (4MS), a SiCN film formed with a lowered flow rate of a tetramethylsilane gas (4MS↓), and a SiCN film formed with a further lowered flow rate of a tetramethylsilane gas (4MS↓↓), the water penetration resistance was evaluated with the thickness changed.

Figure 7:
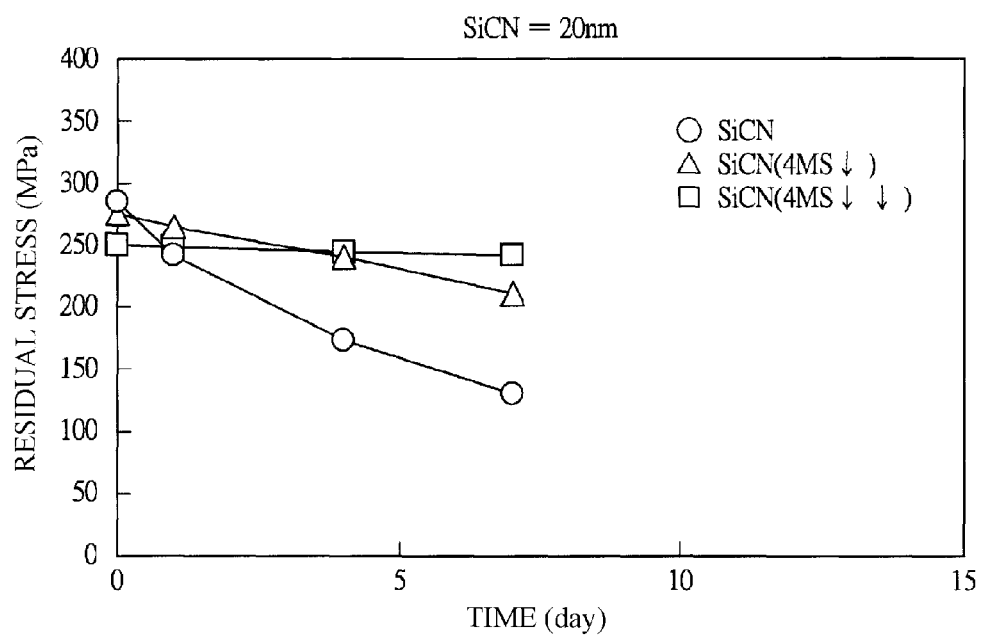
FIG. 7 is a graph showing the result how residual stress of a silicon oxide film changes when the thickness of the SiCN film is 20 nm.

FIG. 7 is a graph showing the result how the residual stress of a silicon oxide film changes when the thickness of the SiCN film is 20 nm. In FIG. 7, the horizontal axis shows time (elapsed time), and the vertical axis shows the residual stress remaining in the silicon oxide film. The silicon oxide film changes in the residual stress by the absorption of moisture. Accordingly, from the change in the residual stress of the silicon oxide film, the permeability of the SiCN film can be evaluated quantitatively. As shown in FIG. 7, the SiCN film formed with a further lowered tetramethylsilane gas (4MS↓↓) flow rate shows little change in the residual stress remaining in the silicon oxide film even when the time elapses. Moreover, the SiCN film formed with a lowered tetramethylsilane gas (4MS↓) flow rate, too, has a smaller change in the residual stress remaining in the silicon oxide film as compared with the film formed with a usual flow rate, but has a larger change as compared with the film formed with a further lowered flow rate. In contrast, in the case of the film formed with a usual tetramethylsilane gas (4MS) flow rate, the residual stress remaining in the silicon oxide film changes remarkably with the elapse of time. Accordingly, when the thickness of the SiCN film is 20 nm, the water penetration resistance of a SiCN film to be formed is improved by lowering the flow rate of the tetramethylsilane gas used in forming the SiCN film. When the thickness is 20 nm, the effect of improving the water penetration resistance appears significantly when a SiCN film is formed with the flow rate of the tetramethylsilane gas lowered.

Figure 8:
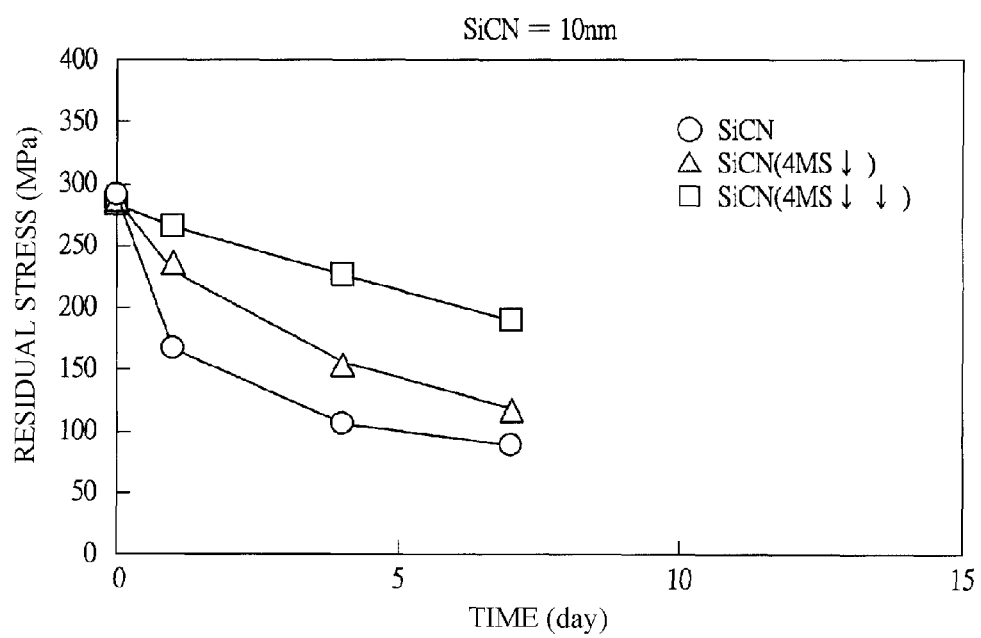
FIG. 8 is a graph showing the result how residual stress of a silicon oxide film changes when the thickness of the SiCN film is 10 nm.

Next, FIG. 8 is a graph showing the result how the residual stress of a silicon oxide film changes when the thickness of the SiCN film is 10 nm. In FIG. 8, the horizontal axis shows time (elapsed time), and the vertical axis shows the residual stress remaining in the silicon oxide film. As shown in FIG. 8, the SiCN film formed with a further lowered tetramethylsilane gas (4MS↓↓) flow rate shows a small change in the residual stress remaining in the silicon oxide film even when the time elapses. Moreover, in the SiCN film formed with a lowered tetramethylsilane gas (4MS↓) flow rate, the amount of change in the residual stress remaining in the silicon oxide film is moderate, although the change is not comparable to that in the case where the flow rate is further lowered. In contrast, in the case of the film formed with an ordinary tetramethylsilane gas (4MS) flow rate, the residual stress remaining in the silicon oxide film has changed remarkably with the elapse of time. Accordingly, when the thickness of the SiCN film is 10 nm, although the water penetration resistance is not comparable to that in the case where the thickness of the SiCN film is 20 nm, the water penetration resistance of the SiCN film to be formed can be improved by lowering the flow rate of the tetramethylsilane gas used in forming the SiCN film. Even in the case where the thickness is 10 nm, the effect of improving the water penetration resistance is seen by forming a SiCN film with a lowered tetramethylsilane gas flow rate.

Figure 9:
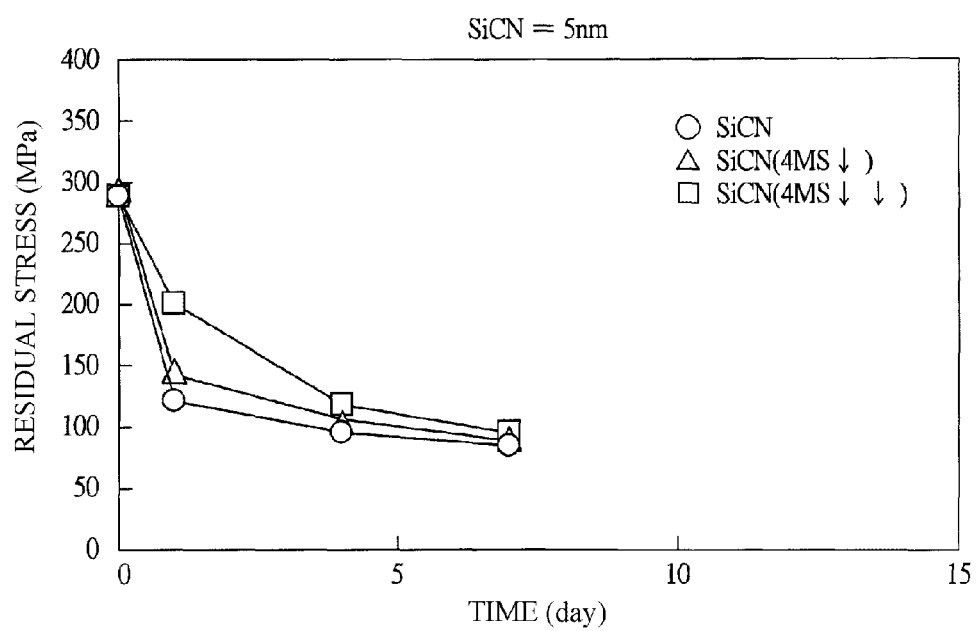
FIG. 9 is a graph showing the result how residual stress of a silicon oxide film changes when the thickness of the SiCN film is 5 nm.

Next, FIG. 9 is a graph showing the result how the residual stress of a silicon oxide film changes when the thickness of the SiCN film is 5 nm. In FIG. 9, the horizontal axis shows time (elapsed time), and the vertical axis shows the residual stress remaining in the silicon oxide film. As shown in FIG. 9, any of cases of the SiCN film formed with a further lowered tetramethylsilane gas (4MS↓↓) flow rate, the SiCN film formed with a lowered tetramethylsilane gas (4MS↓) flow rate and the SiCN film formed with a usual tetramethylsilane gas (4MS) flow rate, the residual stress remaining in the silicon oxide film changes remarkably with the elapse of time. As known from FIG. 9, when the thickness of the SiCN film is around 5 nm, the effect of improving the water penetration resistance does not become obvious any more even when the SiCN film is formed with a lowered tetramethylsilane gas flow rate.

In summarizing the above results, when the film thickness is 10 nm or more, a remarkable effect of improving the water penetration resistance of the SiCN film can be obtained by forming a SiCN film with a lowered tetramethylsilane gas flow rate. But, when the film thickness is around 5 nm, the effect of improving the water penetration resistance of the SiCN film is lead to be not found even by forming the SiCN film with a lowered tetramethylsilane gas flow rate. Accordingly, the thickness of the SiCN film of at least 10 nm or more is required even when the SiCN film is formed with a lowered tetramethylsilane gas flow rate from the viewpoint of improving the water penetration resistance.

<Subject Found Newly by the Present Inventor>

As described above, the inventor obtained the knowledge that the water penetration resistance of a SiCN film can be improved by forming the SiCN film with a lowered tetramethylsilane gas flow rate, and the knowledge that the effect of improving the water penetration resistance cannot be obtained if the film thickness is not set to 10 nm or more even when the SiCN film is formed with a lowered tetramethylsilane gas flow rate. Consequently, using a SiCN film formed with a lowered tetramethylsilane gas flow rate can be considered in place of a SiCN film formed with a usual tetramethylsilane gas flow rate. In this case, because the water penetration resistance of the SiCN film can be improved, the improvement effect of the electromigration properties of the copper wiring and the inter-wire TDDB properties of the interlayer insulating film can be expected. However, as described above, to improve the water penetration resistance, the thickness of the SiCN film needs to be 10 nm or more, and thus the thickness of the SiCN film is set to be 10 nm at least. Actually, the thickness needs to be about 20 nm in consideration of keeping a margin of the water penetration resistance.

When the SiCN film having a thickness of 20 nm formed with a lowered tetramethylsilane gas flow rate is used in place of the SiCN film having a thickness of 20 nm formed with a usual tetramethylsilane gas flow rate, a significant improvement of the water penetration resistance of the SiCN film is foreseen. Thus, the improvement of the reliability of properties, such as the improvement of the electromigration properties of the copper wiring and the inter-wire TDDB properties of the interlayer insulating film, is expected.

But, the inventor has found that a new problem (an adverse effect) occurs when such configuration is adopted as using the SiCN film having a thickness of 20 nm formed with a lowered tetramethylsilane gas flow rate in place of the SiCN film having a thickness of 20 nm formed with a usual tetramethylsilane gas flow rate. The SiCN film formed with a lowered tetramethylsilane gas flow rate has an improved water penetration resistance, and the mechanism of the improvement of the water penetration resistance is that a methyl group ($CH_3$) contained in the SiCN film reduces as the result of the formation with a lowered tetramethylsilane gas flow rate, and that the densification of the film with the reduction of the methyl group ($CH_3$) provides an improved water penetration resistance. The important point is that the densification of the film improves the water penetration resistance. The improvement of the water penetration resistance of the SiCN film is realized by the densification of the film. However, although the densification of the SiCN film is desirable from the viewpoint of the water penetration resistance, there is a controversial point that cannot be said to be appropriate from the viewpoint of lowering the permittivity. The SiCN film formed in a state where the tetramethylsilane gas (4MS) flow rate is lower than usual can improve the water penetration resistance, but in contrast, the inventor has newly found such controversial point that the permittivity of the SiCN film rises is included.

From the viewpoint of lowering the parasitic capacitance between wirings, because a part of the interlayer insulating film existing between wirings with a low permittivity film having a low permittivity is constituted, the SiCN film constituting a part of the interlayer insulating film also has desirably a permittivity as low as possible. Accordingly, the SiCN film being a copper diffusion prevention film is desired to have a water penetration resistance, and at the same time, to have a low permittivity. The configuration using the SiCN film formed with a lowered tetramethylsilane gas flow rate in place of the SiCN film formed with an usual tetramethylsilane gas flow rate is an idea focusing on the viewpoint of the water penetration resistance, but not an idea focusing on the achievement of a low permittivity. Actually, the improvement of the water penetration resistance of the SiCN film is most important, but if possible, it becomes important to improve the water penetration resistance and moreover to control the rise of the permittivity for satisfying both improvement of performance and improvement of reliability of semiconductor devices. With respect to a copper diffusion prevention film constituted from the SiCN film, a configuration capable of improving the water penetration resistance and of avoiding the rise of the permittivity is desired.

Consequently, in Embodiment 1, a contrivance is applied to realize a copper diffusion prevention film having a water penetration resistance and a low permittivity. The technical idea in accordance with the embodiment to which the contrivance is applied will be explained.

<Configuration of Semiconductor Device in Accordance with Embodiment 1>

Figure 10:
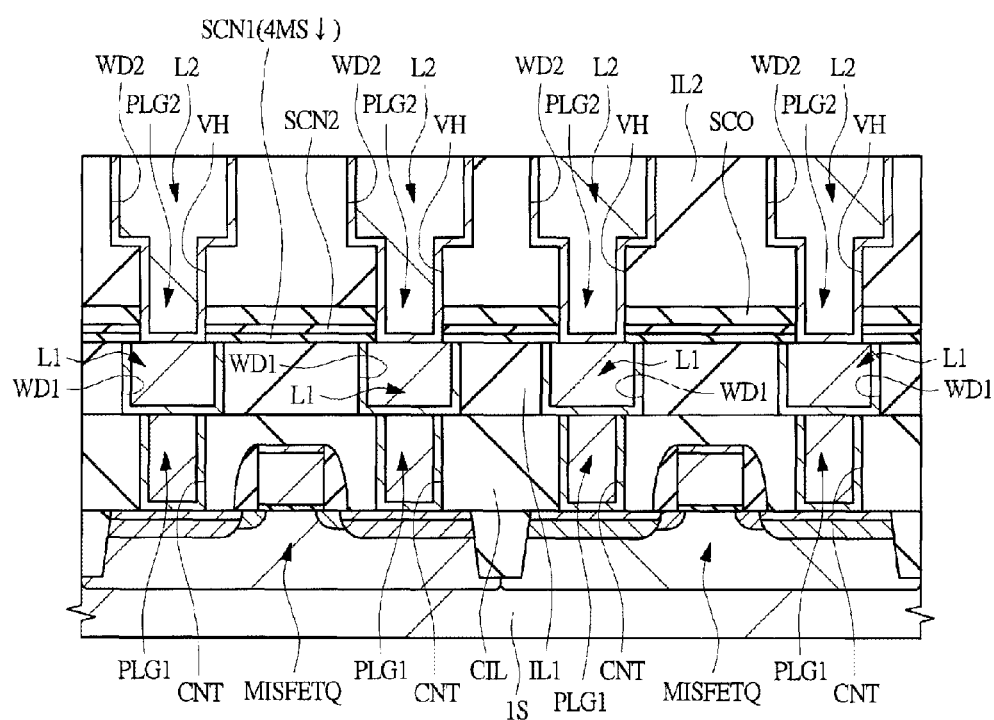
FIG. 10 is a cross-sectional view showing the configuration of the semiconductor device in accordance with Embodiment 1.

FIG. 10 is a cross-sectional view showing the device structure in accordance with Embodiment 1. In FIG. 10, over a semiconductor substrate 1S including a silicon single crystal, a plurality of MISFETs Q is formed. The MISFETs Q are formed in an active region separated by an element isolation region, and have a configuration shown below. Specifically, a well is formed in the active region separated by the element isolation region, and MISFETs Q are formed over the well. The MISFET Q has a gate insulating film including a silicon oxide film over the main face of the semiconductor substrate 1S, and has a gate electrode including a stacked film of a polysilicon film and a silicide film (a nickel silicide film) over the gate insulating film. A sidewall including a silicon oxide film is formed on side walls on both sides of the gate electrode, and, a shallow impurity diffusing region is formed with the gate electrode matched in the semiconductor substrate under the sidewall. And, a deep impurity diffusing region is formed with the sidewall matched outside the shallow impurity diffusing region. A pair of the shallow impurity diffusing regions and a pair of the deep impurity diffusing regions form a source region and a drain region of the MISFET Q, respectively. As described above, the MISFET Q is formed over the semiconductor substrate 1S.

Subsequently, as shown in FIG. 10, a contact interlayer insulating film CIL is formed over the semiconductor substrate 1S having the MISFET Q formed. The contact interlayer insulating film. CIL is formed from a stacked film of an ozone TEOS film formed by a thermal CVD method using ozone and tetraethyl orthosilicate (TEOS) as source gases and a plasma TEOS film formed by a plasma CVD method using TEOS as a source gas, being provided over the ozone TEOS film.

The reason why the contact interlayer insulating film CIL is formed from the TEOS film is that the TEOS film is a film having good covering properties for a step of a foundation. The foundation for forming the contact interlayer insulating film CIL is in a state having unevenness caused by the MISFET Q formed on the semiconductor substrate 1S. Because the MISFET Q is formed on the semiconductor substrate 1S, the gate electrode is formed on the surface of the semiconductor substrate 1S to cause the foundation having unevenness. Accordingly, a film having poor covering properties for steps having unevenness cannot be embedded in fine unevenness to cause void. Consequently, the TEOS film is used as the contact interlayer insulating film CIL. This is because, in the TEOS film formed by using TEOS as the source gas, the TEOS being the source gas forms an intermediate before forming a silicon oxide film, and easily moves on the surface of a film to be formed, and then covering properties for a step of the foundation improve.

Furthermore, as shown in FIG. 10, a plug PLG1 which penetrates the contact interlayer insulating film CIL and reaches the source region and the drain region of the MISFET Q is formed. The plug PLG1 is formed by embedding a barrier conductor film including a titanium/titanium nitride film (the titanium/titanium nitride film shows a film formed from titanium and titanium nitride provided over the titanium) and a tungsten film formed over the barrier conductor film in a contact hole CNT. The titanium/titanium nitride film is a film provided to prevent the diffusion of tungsten constituting the tungsten film into silicon, and is to prevent fluoride attack against the contact interlayer insulating film CIL and the semiconductor substrate 1S from giving damage thereto in a CVD method of performing a reduction treatment of tungsten fluoride ($WF_6$) when the tungsten film is constituted. The contact interlayer insulating film CIL may be formed from either of a silicon oxide film (a $SiO_2$ film) or a SiOF film.

Next, the interlayer insulating film IL1 is formed over the contact interlayer insulating film CIL, and a first layer wiring L1 is formed to be embedded in the interlayer insulating film IL1. Specifically, the interlayer insulating film IL1 is constituted from a SiOC film having a hole, a hydrogen silsesquioxane (HSQ: a silicon oxide film being formed by a coating process and having a Si—H bond, or hydrogen-containing silsesquioxane) film having a hole, or a methyl silsesquioxane (MSQ: a silicon oxide film being formed by a coating process and having a Si—C bond, or a carbon-containing silsesquioxane) film having a hole. By forming the interlayer insulating film IL1 from such materials, the permittivity of the interlayer insulating film IL1 can be lowered. As a result, it is possible to reduce the parasitic capacitance between wirings, and to achieve the high performance of the semiconductor device.

Next, the first layer wiring L1 is formed to be embedded in the interlayer insulating film IL1 formed over the contact interlayer insulating film CIL for which the plug PLG1 has been formed. By embedding a film mainly containing copper (hereinafter, described as a copper film) in a wiring trench WD1 that penetrates the interlayer insulating film IL1 to expose the plug PLG1 at the bottom portion, the first layer wiring L1 is formed. To explain in more detail, the first layer wiring L1 is constituted from a barrier conductor film including a tantalum nitride/tantalum film (hereinafter, the tantalum nitride/tantalum film shows a film constituted of tantalum nitride and tantalum formed over the tantalum nitride) formed on the inner wall of the wiring trench or the titanium/titanium nitride film, and a copper film which is formed over the barrier conductor film and is formed to be embedded in the wiring trench WD1.

The reason why the copper film is not formed directly for the wiring trench WD1 formed over the interlayer insulating film IL1 but a barrier conductor film is formed, as described above, is for preventing the diffusion of copper constituting the copper film into silicon constituting the semiconductor substrate 1S by a heat treatment. A copper atom has a comparatively large diffusion constant into silicon and diffuses easily into silicon. In this case, over the semiconductor substrate 1S, semiconductor devices such as a MISFET Q are formed, and the diffusion of a copper atom into the forming region thereof brings about property deterioration of the semiconductor device represented by a breakdown strength failure. Therefore, the barrier conductor film is provided so that a copper atom does not diffuse from a copper film constituting the first layer wiring L1. The barrier conductor film is a film having such function as preventing the diffusion of a copper atom.

Next, over the interlayer insulating film IL1 for which the first layer wiring L1 is formed, a second layer wiring L2 is formed. Specifically, over the interlayer insulating film IL1 for which the first layer wiring L1 is formed, a barrier insulating film (a liner film) including a SiCN film SCN (4MS↓), a SiCN film SCN2 and a SiCO film SCO is formed, and, over the barrier insulating film, an interlayer insulating film IL2 is formed. The interlayer insulating film IL2 is formed from a SiOC film having a hole, an HSQ film having a hole, or an MSQ film having a hole. The hole has a size (a diameter) of around 1 nm. For the barrier insulating film and the interlayer insulating film IL2, a wiring trench WD2 and a via hole VH are formed, and, to be embedded in the wiring trench WD2, the second layer wiring L2 is formed and, at the same time, to be embedded in the via hole VH, a plug PLG2 is formed. The second layer wiring L2 and the plug PLG2 are also constituted from a barrier conductor film including the tantalum nitride/tantalum film or the titanium/titanium nitride film and a copper film formed over the barrier conductor film.

Because copper wiring is used as the first layer wiring L1 and the second layer wiring L2, the prevention of diffusion of a copper atom is necessary. Consequently, in the first layer wiring L1 and the second layer wiring L2, the copper wiring is constituted by forming a copper film for the wiring trench WD1, the wiring trench WD2 or the via hole VH via the barrier conductor film. In the first layer wiring L1 and the second layer wiring L2, a copper film is not directly embedded in the wiring trench WD1 and the wiring trench WD2, but the barrier conductor film is formed on the side wall and the bottom surface of the wiring trench WD1 and the wiring trench WD2 and the copper film is formed over the barrier conductor film. This prevents the diffusion of a copper atom constituting the copper film by the barrier conductor film. At that time, the barrier conductor film is formed only on side walls and bottom surfaces of the wiring trench WD1 and the wiring trench WD2. Accordingly, a copper atom may diffuse from the upper part of the wiring trench WD1. The reason why the barrier conductor film is not formed in the upper part of the wiring trench WD1 is as follows. When the barrier conductor film is formed over the upper part of the wiring trench WD1, the barrier conductor film is formed over a plurality of wiring trenches WD1. This means that copper wirings formed over the wiring trenches WD1 are in a conduction state by the barrier conductor film formed in the upper part of the wiring trenches WD1 and copper wirings different from each other are short-circuited. Accordingly, the barrier conductor film cannot be formed in the upper part of the copper wiring.

However, the prevention of the diffusion of a copper atom from the upper part of the wiring trench WD1 is necessary. Consequently, in the upper part of the copper wiring, a barrier insulating film being an insulating film and having a function of preventing the diffusion of a copper atom is formed. The barrier insulating film is formed from a stacked film of a SiCN film and a SiCO film. This makes it possible to prevent the diffusion of a copper atom from the copper wiring. The diffusion of a copper atom from the side wall and the bottom part of the wiring trench WD1 over which the copper wiring is formed is prevented by the barrier conductor film, and the diffusion of a copper atom from the upper part of the wiring trench WD1 is prevented by the barrier insulating film.

FIG. 10 shows only up to the second layer wiring L2, but in an actual semiconductor device, multilayer wiring is formed over the second layer wiring L2. Because the structure of the multilayer wiring formed over the second layer wiring L2 is approximately the same as that of the second layer wiring L2, the explanation is omitted.

<Feature of the Embodiment 1>

The semiconductor device in accordance with Embodiment 1 is constituted as described above, and further, the characteristic configuration in accordance with Embodiment 1 will be described in detail. In FIG. 10, the characteristic configuration in accordance with Embodiment 1 lies in the configuration of the barrier insulating film (the liner film). In usual semiconductor devices, the barrier insulating film is constituted from a SiCN film and a SiCO film formed over the SiCN film. Embodiment 1 is characterized in that the barrier insulating film is constituted from the SiCN film SCN1 (4MS↓) formed with a tetramethylsilane gas flow rate lower than usual, the SiCN film SCN2 formed with a usual tetramethylsilane gas flow rate formed over the SiCN film SCN1 (4MS↓), and the SiCO film SCO formed over the SiCN film SCN2. The feature of the embodiment 1 lies in that the film usually formed from a single SiCN film is formed from two layers of SiCN films formed with different tetramethylsilane gas flow rates. Specifically, in Embodiment 1, films formed by different process conditions, the SiCN film SCN1 (4MS↓) formed with a tetramethylsilane gas flow rate lower than usual and the SiCN film SCN2 formed over the SiCN film SCN1 (4MS↓) and formed with a usual tetramethylsilane gas flow rate, are used. The difference in process conditions of the SiCN film SCN1 (4MS↓) and the SiCN film SCN2 formed with different tetramethylsilane gas flow rates is revealed as the difference in a methyl group ($CH_3$) contained in the SiCN films. In the SiCN film. SCN1 (4MS↓) formed with a tetramethylsilane gas flow rate lower than usual, because the amount of a source gas containing a methyl group ($CH_3$) becomes smaller, the amount of methyl groups ($CH_3$) contained in a SiCN film SCN1 (4MS↓) to be formed becomes smaller. In contrast, the SiCN film SCN2 formed with a usual tetramethylsi lane gas flow rate contains a larger amount of methyl groups ($CH_3$) than the SiCN film SCN1 (4MS↓). As a result, in Embodiment 1, the SiCN film SCN2 having a larger content of a methyl group ($CH_3$) is formed over the SiCN film SCN1 (4MS↓) having a smaller content of a methyl group ($CH_3$).

In the SiCN film SCN1 (4MS↓) having a smaller content of a methyl group ($CH_3$), the densification of the film can be achieved to provide an excellent water penetration resistance. Accordingly, using the SiCN film SCN1 (4MS↓) having a smaller content of a methyl group ($CH_3$) as the barrier insulating film can reduce moisture reaching the copper wiring (the first layer wiring L1) after passing through the barrier insulating film. Consequently, the oxidation of the copper wiring due to moisture can be prevented, and then, the lowering of the adherence between the copper wiring and the barrier insulating film can be controlled to prevent the deterioration of the electromigration properties of the copper wiring.

In contrast, the SiCN film SCN1 (4MS↓) having a smaller content of a methyl group ($CH_3$) can achieve the densification of the film to provide an excellent water penetration resistance, but causes a problem of the rise of the permittivity due to the densification of the film (specific permittivity of 5.0 to 5.5). In Embodiment 1, the SiCN film SCN2 having a content of a methyl group ($CH_3$) larger than that of the SiCN film SCN1 (4MS↓) is provided over the SiCN film SCN1 (4MS↓). The SiCN film SCN2 contains a methyl group ($CH_3$) in a large content in the film. Consequently, because the film is not densified as compared with the SiCN film. SCN1 (4MS↓), the rise of the permittivity can be controlled (specific permittivity of 4.0 to 4.9).

As described above, each of the SiCN film SCN1 (4MS↓) having a smaller content of a methyl group ($CH_3$) and the SiCN film SCN2 having a larger content of a methyl group ($CH_3$) has an advantage and a drawback, and the combination of the two can satisfy both the improvement of the water penetration resistance and low permittivity properties. The SiCN film SCN1 (4MS↓) having a smaller content of a methyl group ($CH_3$) has the advantage of the excellent water penetration resistance, but has the drawback of the rise in the permittivity. In contrast, the SiCN film SCN2 having a larger content of a methyl group ($CH_3$) has the advantage of the achievement of a low permittivity, but has the drawback of the deterioration of the water penetration resistance.

Accordingly, using the SiCN film SCN1 (4MS↓) having a smaller content of a methyl group ($CH_3$) alone can exert the advantage of excellent water penetration resistance, but causes the problem of rise in the permittivity. Using the SiCN film SCN2 having a larger content of a methyl group ($CH_3$) alone can achieve the low permittivity, but the water penetration resistance is deteriorated. Consequently, by adopting the stacked structure of the SiCN film SCN1 (4MS↓) having a smaller content of a methyl group ($CH_3$) and the SiCN film SCN2 having a larger content of a methyl group ($CH_3$) as in Embodiment 1, the water penetration resistance can be improved while the low permittivity is achieved.

Compared with a configuration using the SiCN film SCN1 (4MS↓) having a smaller content of a methyl group ($CH_3$) alone, the stacked configuration in accordance with Embodiment 1 has a construction more advantageous for a low permittivity. In contrast, compared with the configuration using the SiCN film SCN2 having a larger content of a methyl group ($CH_3$) alone, the stacked configuration in accordance with Embodiment 1 can more improve the water penetration resistance. As described above, the feature of the embodiment 1 lies in that, by combining films each having exactly the opposite advantage and drawback, the actualization of drawbacks can be controlled and both advantages can be realized. Specifically, in Embodiment 1, the improvement of the water penetration resistance and the low permittivity can be realized with good balance.

Because the SiCN film SCN1 (4MS↓) having a smaller content of a methyl group ($CH_3$) requires a thickness of 10 nm or more to improve the water penetration resistance, it is possible to set the thickness of the SiCN film SCN1 (4MS↓) having a smaller content of a methyl group ($CH_3$) to be 10 nm and to set the thickness of the SiCN film SCN2 having a larger content of a methyl group ($CH_3$) to be also 10 nm. By setting the thickness of the SiCN film SCN1 (4MS↓) having a smaller content of a methyl group ($CH_3$) to be equal to the thickness of the SiCN film SCN2 having a larger content of a methyl group ($CH_3$), the water penetration resistance and the low permittivity can be improved with good balance. However, from the viewpoint of placing importance on the improvement of the water penetration resistance, a configuration can be adopted in which the SiCN film SCN1 (4MS↓) is thicker than the SiCN film SCN2.

A further feature in accordance with Embodiment 1 lies in that the SiCN film SCN1 (4MS↓) is directly brought into contact with the copper wiring (the first layer wiring L1). This makes it possible to improve electromigration properties caused by the improvement of the water penetration resistance of the SiCN film SCN1 (4MS↓) and to improve electromigration properties based on another mechanism. In the SiCN film SCN1 (4MS↓) improved in the water penetration resistance, the densification of the film has been achieved. That the densification of the film has been achieved means that the modulus of elasticity of the SiCN film SCN1 (4MS↓) is also improved (hardened). Accordingly, by directly bringing the SiCN film SCN1 (4MS↓) having an improved modulus of elasticity into contact with the copper wiring, even when electromigration is going to occur in the copper wiring due to the movement of an atom, the movement of atoms constituting the copper wiring is suppressed by the SiCN film SCN1 (4MS↓) having an improved modulus of elasticity. As described above, by adopting the configuration in which the SiCN film. SCN1 (4MS↓) is directly brought into contact with the copper wiring (the first layer wiring L1), due to a synergetic effect of the improvement of the water penetration resistance and the improvement of the modulus of elasticity, electromigration properties of the copper wiring can be further improved.

<The Method of Manufacturing a Semiconductor Device in Accordance with Embodiment 1>

The semiconductor device in accordance with Embodiment 1 is constituted as described above, and the method of manufacturing the same will be explained below with reference to the drawings.

Figure 11:
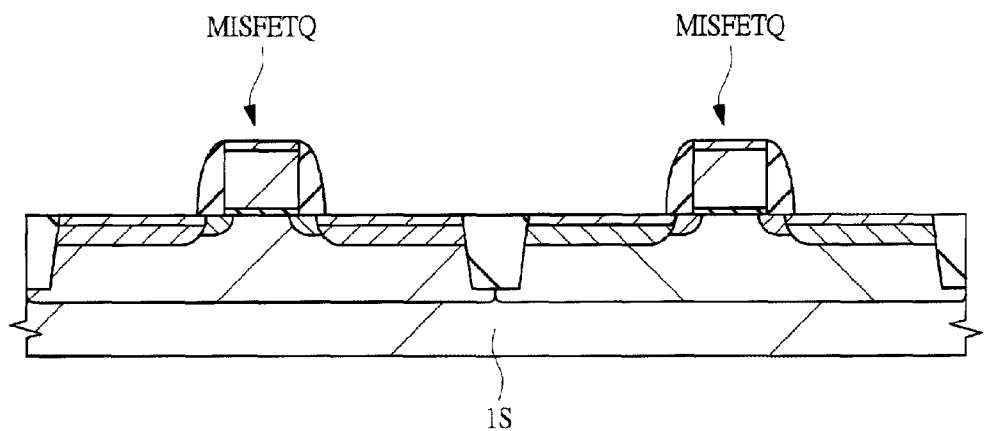
FIG. 11 is a cross-sectional view showing a manufacturing process of the semiconductor device in accordance with Embodiment 1.
Figure 12:
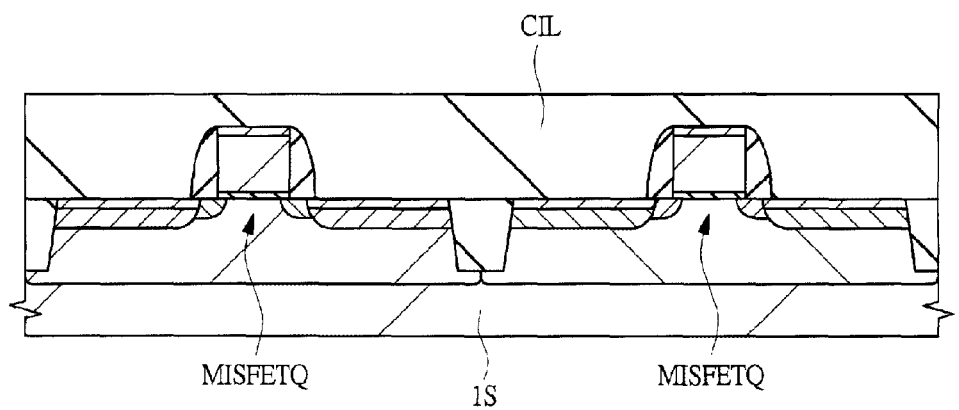
FIG. 12 is a cross-sectional view showing the manufacturing process of the semiconductor device following FIG. 11.

First, as shown in FIG. 11, a plurality of MISFETs Q is formed over the semiconductor substrate 1S by using a usual technique of manufacturing a semiconductor. Subsequently, as shown in FIG. 12, over the semiconductor substrate 1S for which the MISFETs Q are formed, the contact interlayer insulating film CIL is formed. The contact interlayer insulating film CIL is formed to cover the plurality of MISFETs Q. Specifically, the contact interlayer insulating film CIL is formed from a stacked film of an ozone TEOS film formed by a thermal CVD method using ozone and TEOS as source gases and a plasma TEOS film provided over the ozone TEOS film and formed by a plasma CVD method using TEOS as a source gas. On the lower side of the ozone TEOS film, an etching stopper film including a silicon nitride film may be formed.

Figure 13:
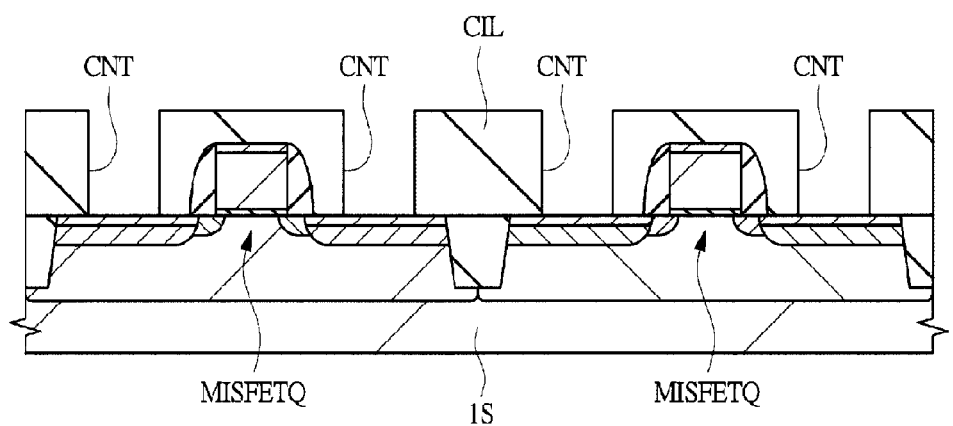
FIG. 13 is a cross-sectional view showing the manufacturing process of the semiconductor device following FIG. 12.

Next, as shown in FIG. 13, a contact hole CNT is formed for the contact interlayer insulating film CIL by using a photolithographic technique and an etching technique. The contact hole CNT is processed to pass through the contact interlayer insulating film CIL to reach the source region or the drain region of the MISFET Q formed on the semiconductor substrate 1S.

Figure 14:
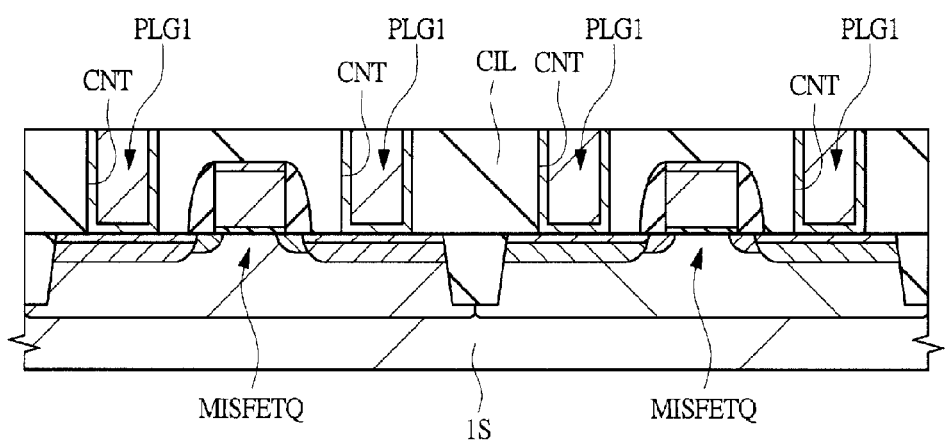
FIG. 14 is a cross-sectional view showing the manufacturing process of the semiconductor device following FIG. 13.

Subsequently, as shown in FIG. 14, the contact hole CNT formed for the contact interlayer insulating film CIL is embedded in a metal film to form the plug PLG1. Specifically, over the contact interlayer insulating film CIL for which the contact hole CNT is formed, a titanium/titanium nitride film to be a barrier conductor film is formed using sputtering. And, over the titanium/titanium nitride film, a tungsten film is formed. This forms the titanium/titanium nitride film on the inner wall (the side wall and bottom surface) of the contact hole CNT, and the tungsten film is formed to be embedded in the contact hole CNT over the titanium/titanium nitride film. After that, unnecessary titanium/titanium nitride film and tungsten film formed over the contact interlayer insulating film CIL are removed by a chemical mechanical polishing (CMP) method. This can form the plug PLG1 embedding the titanium/titanium nitride film and the tungsten film only in the contact hole CNT.

Figure 15:
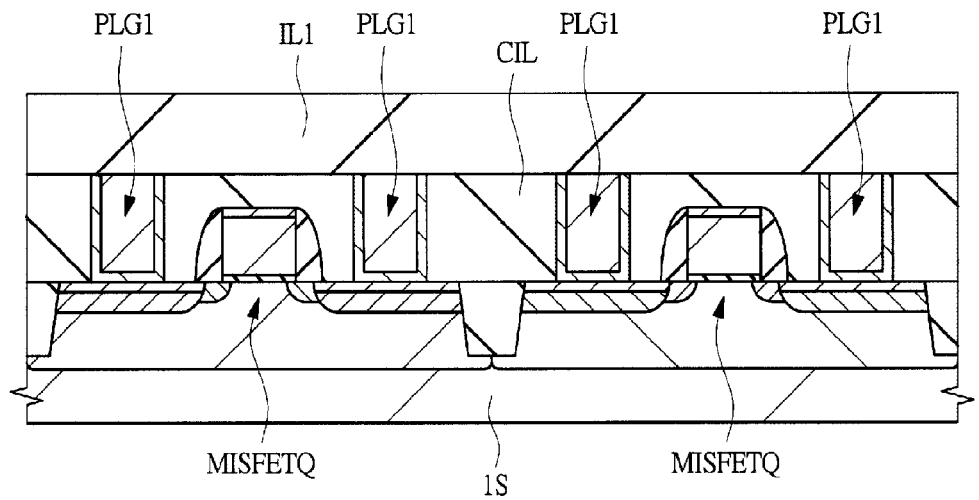
FIG. 15 is a cross-sectional view showing the manufacturing process of the semiconductor device following FIG. 14.

Next, as shown in FIG. 15, over the contact interlayer insulating film CIL for which the plug PLG1 is formed, the interlayer insulating film IL1 is formed. The interlayer insulating film IL1 is formed from a SiOC film having a hole, and is formed by using a plasma CVD method. The SiOC film having a hole is formed by forming a SiOC film containing porogen and then by performing cure. The cure causes the porogen to be sublimated and then a hole for the SiOC film to be formed.

Figure 16:
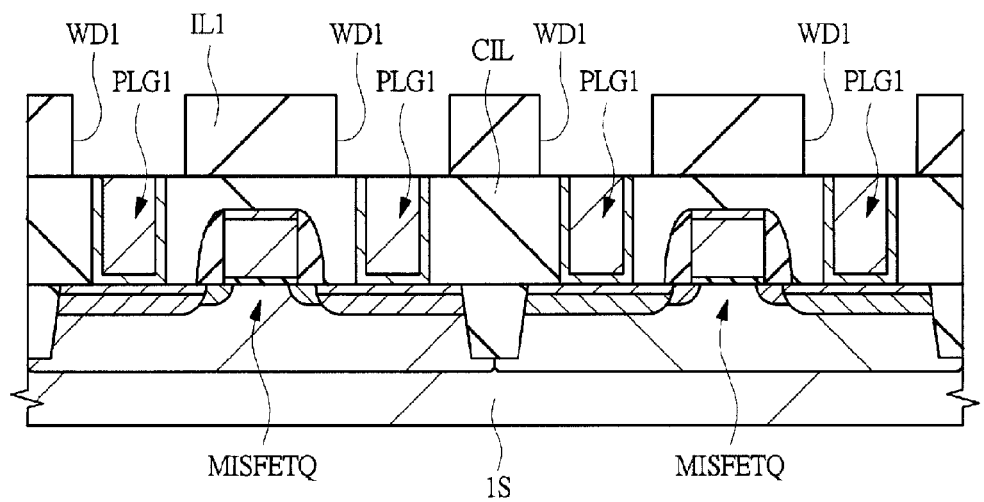
FIG. 16 is a cross-sectional view showing the manufacturing process of the semiconductor device following FIG. 15.

Then, as shown in FIG. 16, the wiring trench WD1 is formed in the interlayer insulating film IL1 using a photolithographic technique and an etching technique. The wiring trench WD1 is formed so that it penetrates the interlayer insulating film IL1 including a SiOC film having a hole and its bottom surface reaches the contact interlayer insulating film CIL. This leads to the exposure of the surface of the plug PLG1 at the bottom part of the wiring trench WD1.

Figure 17:
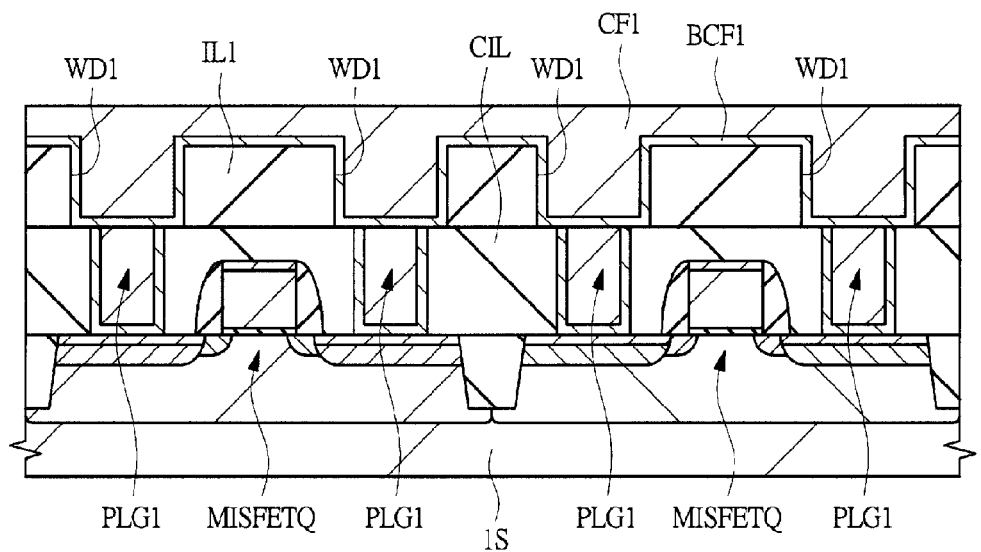
FIG. 17 is a cross-sectional view showing the manufacturing process of the semiconductor device following FIG. 16.

After that, as shown in FIG. 17, over the interlayer insulating film. IL1 in which the wiring trench WD1 is formed, a barrier conductor film (a copper diffusion prevention film) BCF1 is formed. Specifically, the barrier conductor film. BCF1 is constituted from tantalum (Ta), titanium (Ti), ruthenium (Ru), tungsten (W), manganese (Mn) or nitride or nitriding silicide of these materials, or a stacked film of these materials, and is formed using a sputtering method.

Subsequently, inside the wiring trench WD1 and over the barrier conductor film BCF1 formed over the interlayer insulating film. IL1, a seed film including a thin copper film is formed by a sputtering method. Then, by an electrolytic plating method using the seed film as an electrode, a copper film CF1 is formed. The copper film CF1 is formed to be embedded in the wiring trench WD1. The copper film CF1 is formed from a film mainly containing copper. Specifically, it is formed from copper (Cu) or a copper alloy (an alloy of copper (Cu) with aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), lanthanoid-based metal, or actinoid-basedmatal). When a copper alloy is used, because the seed film is an alloy described above, the copper film CF1 becomes a film of a copper alloy. Copper alloys to be mentioned later are the same.

Figure 18:
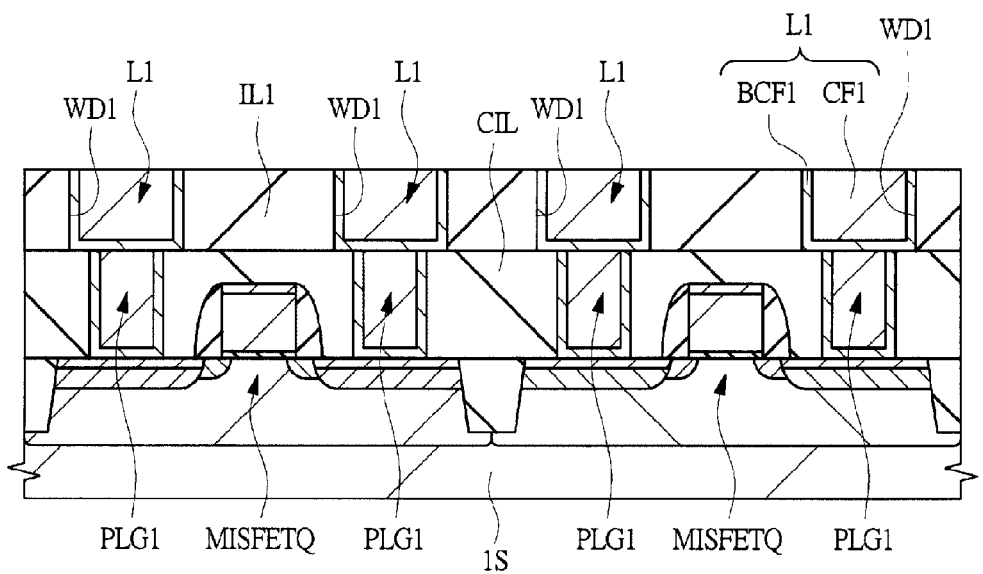
FIG. 18 is a cross-sectional view showing the manufacturing process of the semiconductor device following FIG. 17.

Next, as shown in FIG. 18, unnecessary barrier conductor film BCF1 and copper film CF1 formed over the interlayer insulating film IL1 are removed by a CMP method. This can form the first layer wiring L1 formed by embedding the barrier conductor film BCF1 and the copper film CF1 in the wiring trench WD1.

After that, the surface of the interlayer insulating film IL1 for which the first layer wiring L1 is formed is subjected to an ammonia plasma treatment to clean the surface of the first layer wiring L1 and that the of the interlayer insulating film IL1.

Figure 19:
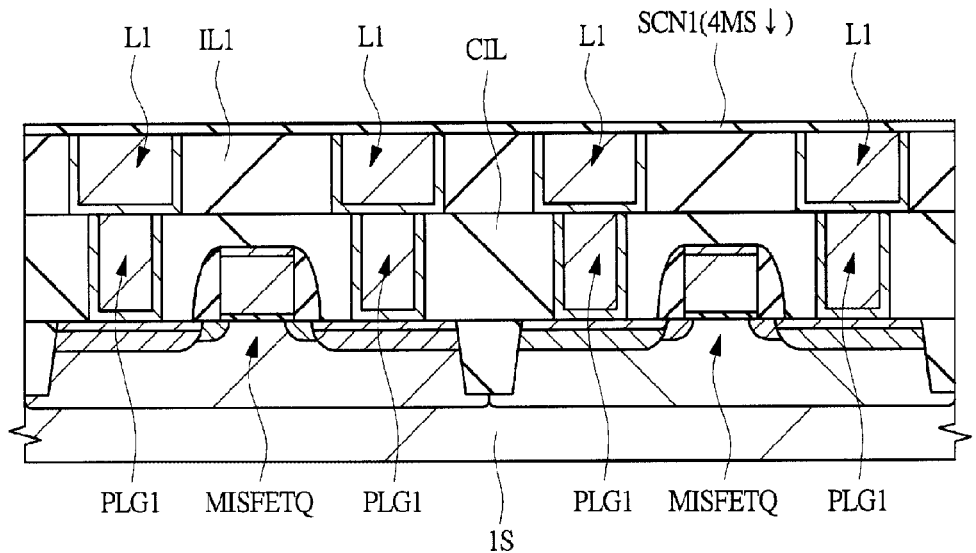
FIG. 19 is a cross-sectional view showing the manufacturing process of the semiconductor device following FIG. 18.

Subsequently, as shown in FIG. 19, over the interlayer insulating film IL1 for which the first layer wiring L1 is formed, the SiCN film SCN1 (4MS↓) is formed. The SiCN film SCN1 (4MS↓) can be formed by a CVD method using tetramethylsilane gas with a flow rate lower than usual and ammonia gas as source gases. In Embodiment 1, because the SiCN film. SCN1 (4MS↓) is formed after subjecting the surface of the interlayer insulating film IL1 for which the first layer wiring L1 is formed to the cleaning treatment by the ammonia plasma treatment, the adherence between the interlayer insulating film IL1 and the SiCN film. SCN1 (4MS↓) is improved.

Figure 20:
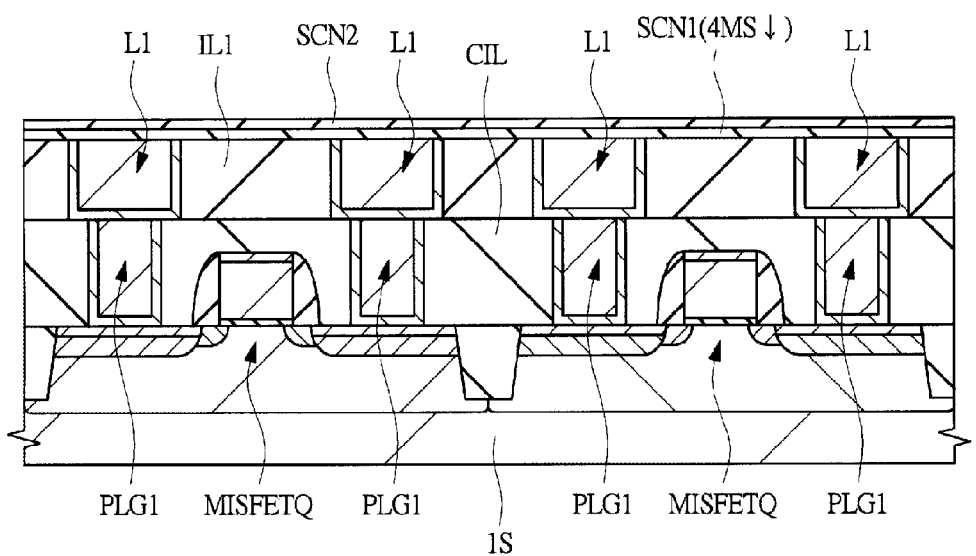
FIG. 20 is a cross-sectional view showing the manufacturing process of the semiconductor device following FIG. 19.

After that, as shown in FIG. 20, over the SiCN film SCN1 (4MS↓), the SiCN film SCN2 is formed. The SiCN film SCN2 can be formed by a CVD method using a tetramethylsilane gas with a usual flow rate and ammonia gas as source gases.

As described above, first, by a CVD method using a tetramethylsilane gas with a lowered flow rate, the SiCN film SCN1 (4MS↓) having a smaller content of a methyl group (CH$_3$) and being densified can be formed, and, over the SiCN film SCN1 (4MS↓), by a CVD method using a tetramethylsilane gas with a flow rate returned to an ordinary condition, the SiCN film SCN2 having a larger content of a methyl group (CH$_3$) can be formed. In Embodiment 1, only by controlling the flow rate of the tetramethylsilane gas, the SiCN film SCN1 (4MS↓) having a smaller content of a methyl group (CH$_3$) and the SiCN film SCN2 having a larger content of a methyl group (CH$_3$) can be formed. At that time, the thickness of the SiCN film SCN1 (4MS↓) is around 10 nm, and that of the SiCN film SCN2 is also around 10 nm. As described above, the SiCN film SCN1 (4MS↓) densified to give an improved water penetration resistance and the SiCN film SCN2 having a permittivity lower than that of the SiCN film SCN1 (4MS↓) can be formed.

Figure 21:
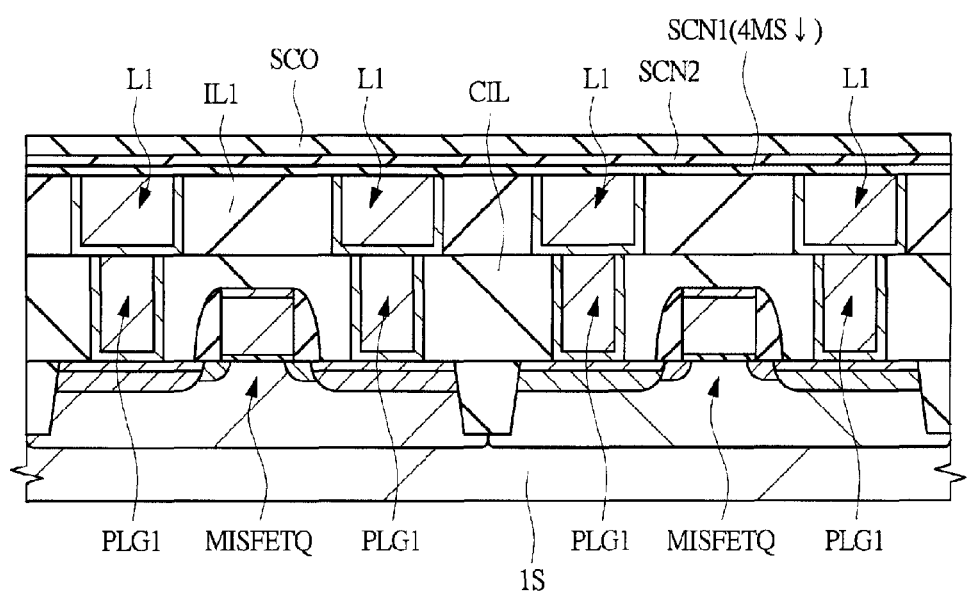
FIG. 21 is a cross-sectional view showing the manufacturing process of the semiconductor device following FIG. 20.

After that, as shown in FIG. 21, over the SiCN film SCN2, the SiCO film SCO is formed. The SiCO film SCO can be formed by a CVD method, and the thickness is around 20 nm. This can form a barrier insulating film including the SiCN film SCN1 (4MS↓), the SiCN film SCN2 and the SiCO film SCO.

Figure 22:
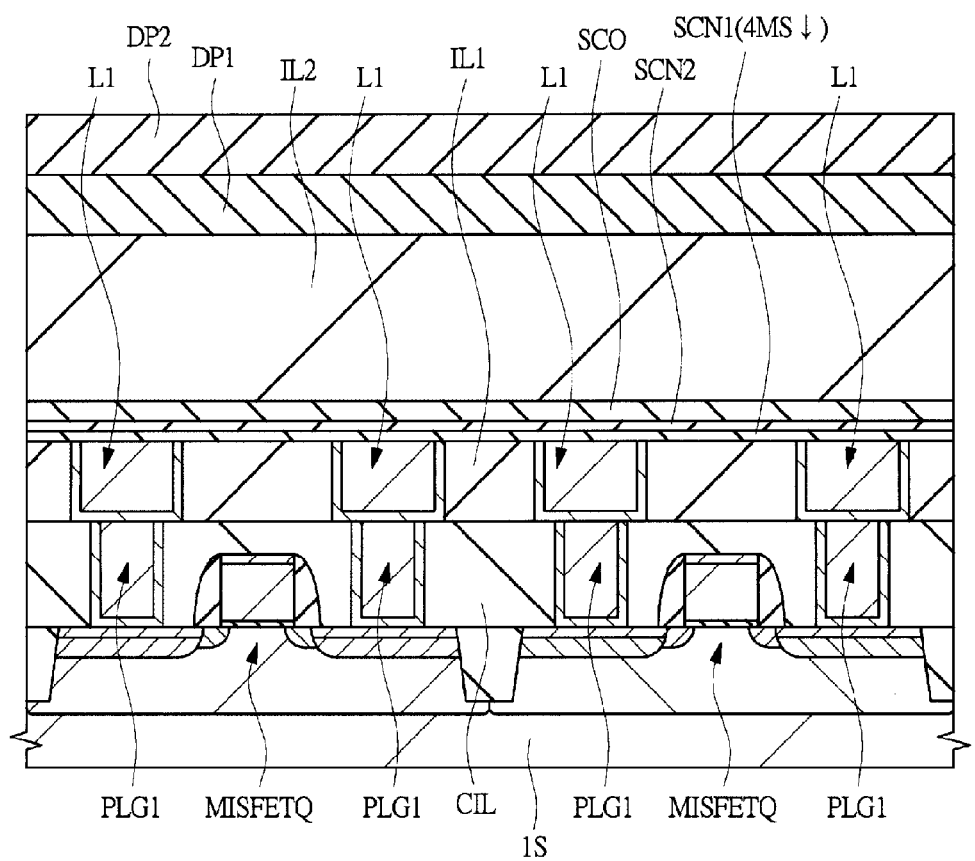
FIG. 22 is a cross-sectional view showing the manufacturing process of the semiconductor device following FIG. 21.

Then, as shown in FIG. 22, over the barrier insulating film, the interlayer insulating film IL2 is formed, and, over the interlayer insulating film IL2, a damage protective film DP1 is formed. Furthermore, over the damage protective film DP1, a damage protective film DP2 is formed. Specifically, the interlayer insulating film IL2 is formed from a SiOC film having a hole with a permittivity lower than that of a silicon oxide film, an HSQ film having a hole, or an MSQ film having a hole. The SiOC film having a hole can be formed by using a plasma CVD method. The damage protective film DP1 is formed from a SiOC film by a plasma CVD method. Furthermore, the damage protective film DP2 is constituted from a TEOS film or a silicon oxide film.

Figure 23:
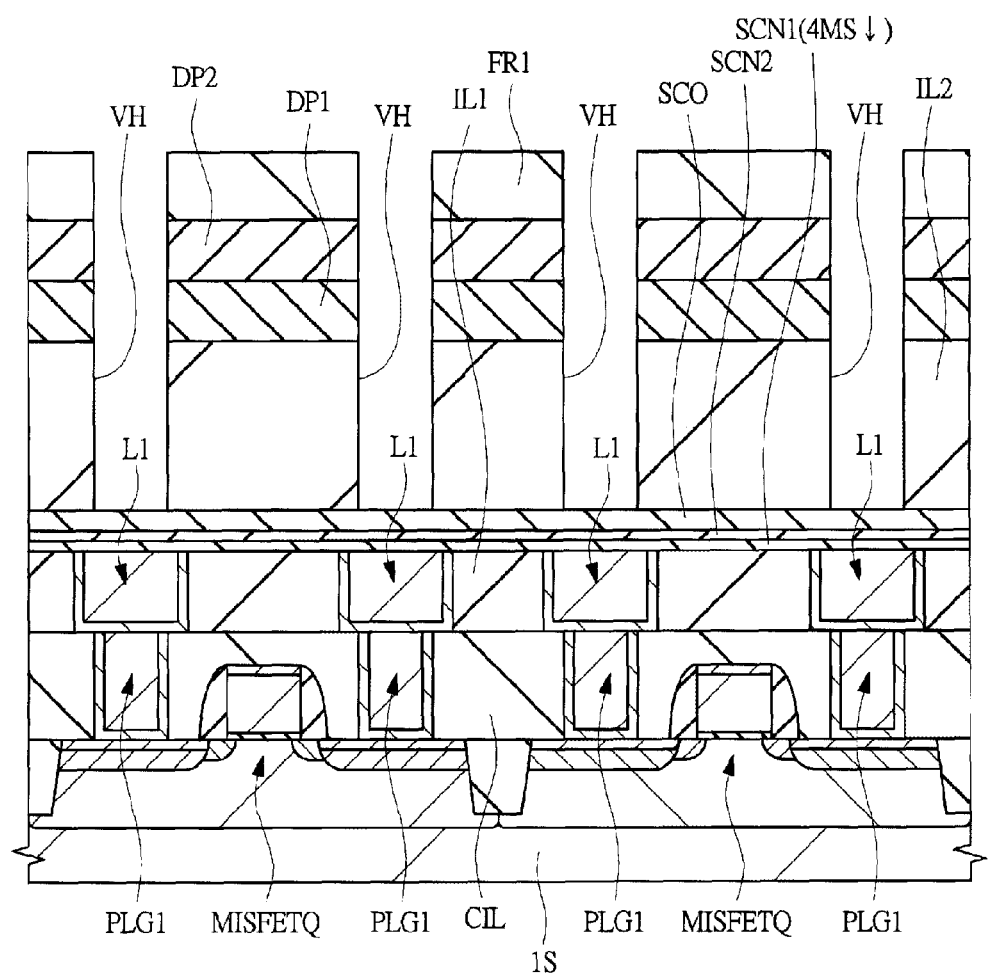
FIG. 23 is a cross-sectional view showing the manufacturing process of the semiconductor device following FIG. 22.

Subsequently, as shown in FIG. 23, over the damage protective film DP2, a photoresist film FR1 constituted from a chemically amplified resist is formed. And, the photoresist film FR1 is subjected to an exposure/development treatment to pattern the photoresist film FR1. The patterning is performed to open a region in which a via hole is to be formed. After that, using the patterned photoresist film FR1 as a mask, the damage protective film DP2, the damage protective film DP1, and the interlayer insulating film IL2 are etched. This can form the via hole VH passing through the damage protective film DP2, the damage protective film DP1 and the interlayer insulating film IL2 to expose the SiCO film SCO. As described above, the SiCO film SCO functions as an etching stopper in the etching.

Figure 24:
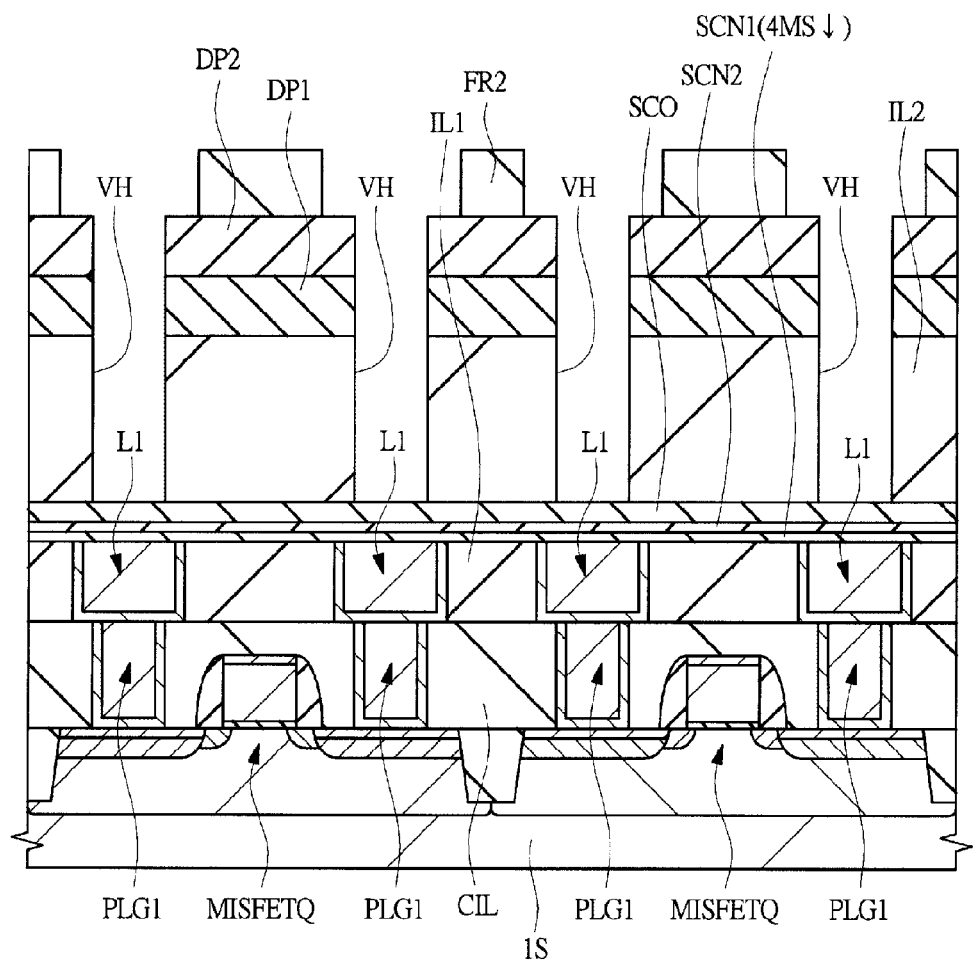
FIG. 24 is a cross-sectional view showing the manufacturing process of the semiconductor device following FIG. 23.

Next, as shown in FIG. 24, the patterned photoresist film FR1 is removed, the photoresist film FR2 constituted from a chemically amplified resist is formed over the damage protective film DP2, and then, the photoresist film FR2 is subjected to an exposure/development treatment to pattern the photoresist film FR2. The patterning of the photoresist film FR2 is performed to open a region for forming a wiring trench. At that time, because the SiCO film SCO is formed, resist poisoning for the photoresist film FR2 can be prevented. The resist poisoning is a phenomenon as described below. In this phenomenon, nitrogen contained in the ammonia plasma treatment or nitrogen contained in the SiCN film SCN1 (4MS↓) and the SiCN film SCN2 chemically reacts to generate amine, and the amine diffuses into the interlayer insulating film IL2. The diffused amine reaches the via hole VH formed in the interlayer insulating film IL2. At that time, when the photoresist film FR2 is exposed and patterned into a pattern for forming a wiring trench, the photoresist film FR2 formed near the via hole VH is a chemically amplified resist, and, in the chemically amplified resist, because an exposure reaction progresses by the generation of acid when exposed, the acid reacts with amine being a base diffused from the via hole VH to neutralize the acid. It is a phenomenon that, as a result, the photoresist film FR2 near the via hole VH is deactivated to provide an exposure failure. When the resist poisoning occurs, the patterning of the photoresist film FR2 becomes poor. In Embodiment 1, to prevent nitrogen contained in the ammonia plasma treatment, or amine generated by the chemical reaction of nitrogen contained in the SiCN film. SCN1 (4MS↓) and the SiCN film. SCN2 from diffusing into the interlayer insulating film IL2, the SiCO film SCO is provided over the stacked film of the SiCN film SCN1 (4MS↓) and the SiCN film SCN2. The barrier insulating film is constituted from the stacked film of the SiCN film SCN1 (4MS↓), the SiCN film SCN2 and the SiCO film. The SiCN film SCN1 (4MS↓) and the SiCN film SCN2 are films which function as a copper diffusion prevention film having a function of preventing the diffusion of copper from the copper wiring, and the SiCO film SCO is a film to prevent the diffusion of amine generating in the SiCN film SCN1 (4MS↓) and the SiCN film SCN2 to control the resist poisoning. As the material, in place of the SiCO film SCO, even a silicon oxide film or a TEOS film exerts the same effect. From the above, the SiCO film. SCO has a function of an etching stopper in forming the via hole VH, and a function of controlling the resist poisoning.

Figure 25:
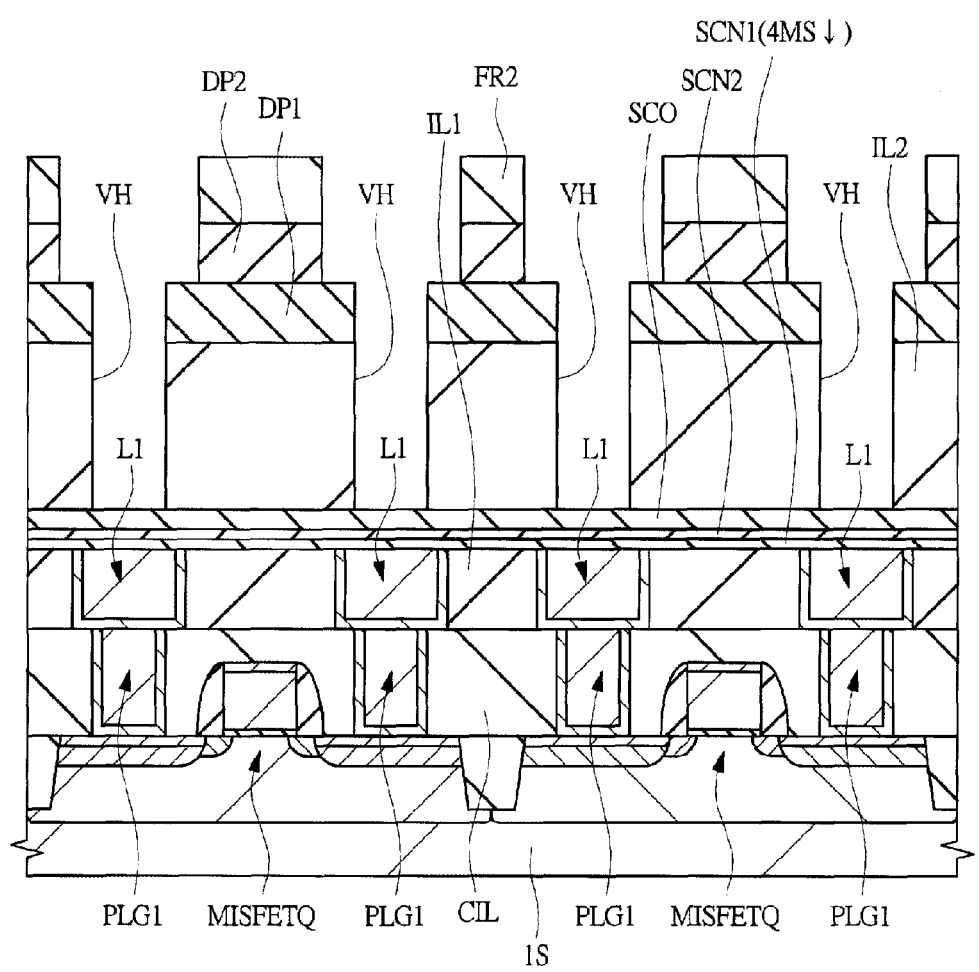
FIG. 25 is a cross-sectional view showing the manufacturing process of the semiconductor device following FIG. 24.
Figure 26:
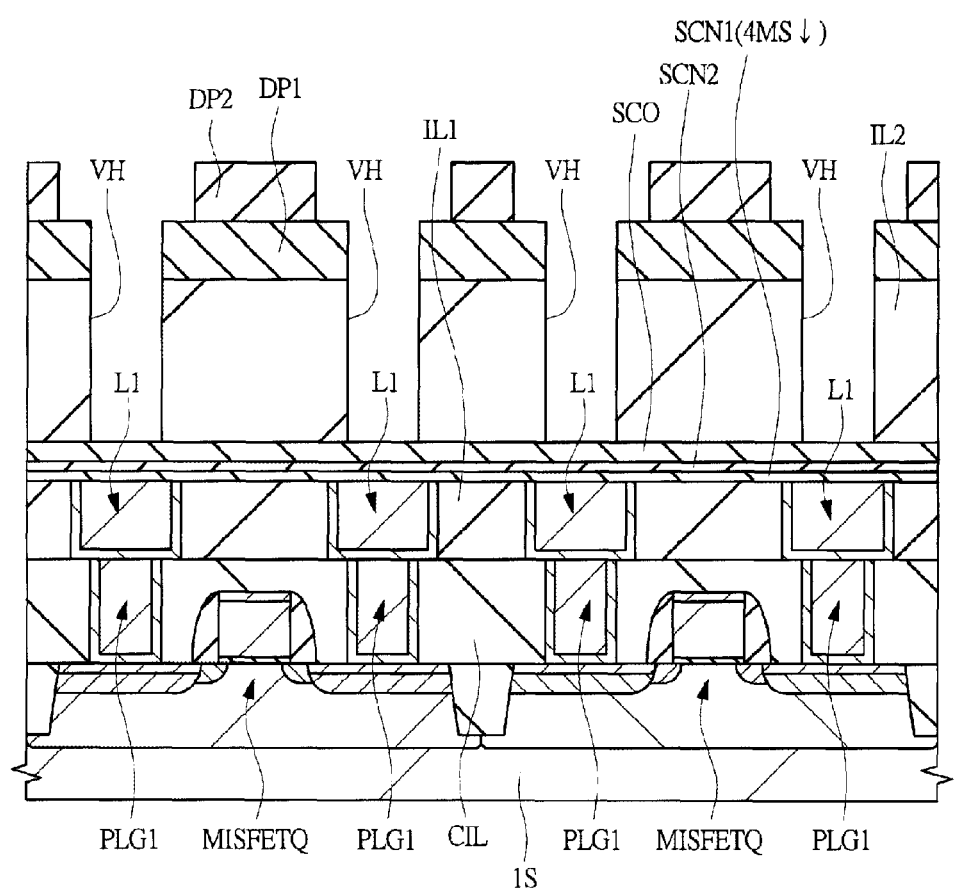
FIG. 26 is a cross-sectional view showing the manufacturing process of the semiconductor device following FIG. 25.

After that, as shown in FIG. 25, the damage protective film DP2 is etched by anisotropic etching using the patterned photoresist film FR2 as a mask. In the etching at this time, the damage protective film DP1 lying on the lower side of the damage protective film DP2 functions as an etching stopper. And, as shown in FIG. 26, the patterned photoresist film FR2 is removed by a plasma ashing treatment. In the plasma ashing treatment, because a patterning corresponding to the wiring trench is not performed on the interlayer insulating film IL2, no damage due to the plasma ashing treatment is added to the wiring trench.

Figure 27:
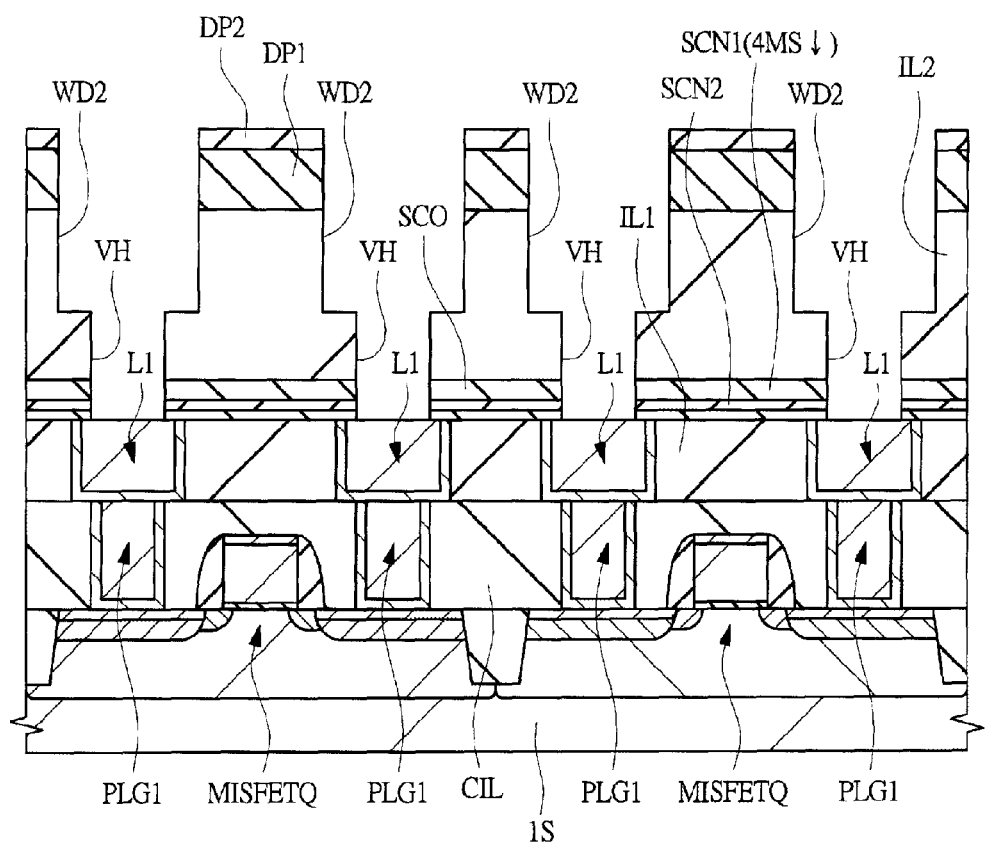
FIG. 27 is a cross-sectional view showing the manufacturing process of the semiconductor device following FIG. 26.

Subsequently, as shown in FIG. 27, the barrier insulating film (the SiCN film SCN1 (4MS↓), the SiCN film SCN2 and the SiCO film SCO) exposed at the bottom part of the via hole VH is removed (hereinafter, called liner etching). This leads to the exposure of the surface of the first layer wiring L1 at the bottom part of the via hole VH. By the liner etching at this time, the surface of the patterned damage protective film DP2, the damage protective film DP1 exposed from the damage protective film DP2, and a part of the interlayer insulating film IL2 lying on the lower side of the damage protective film DP1 are also etched to form the wiring trench WD2. By the liner etching, the thickness of the damage protective film DP2 reduces to around one third. By such liner etching, it is possible to avoid the damage by the plasma ashing treatment and to improve the in-plane uniformity of the height of the wiring trench WD2.

Figure 28:
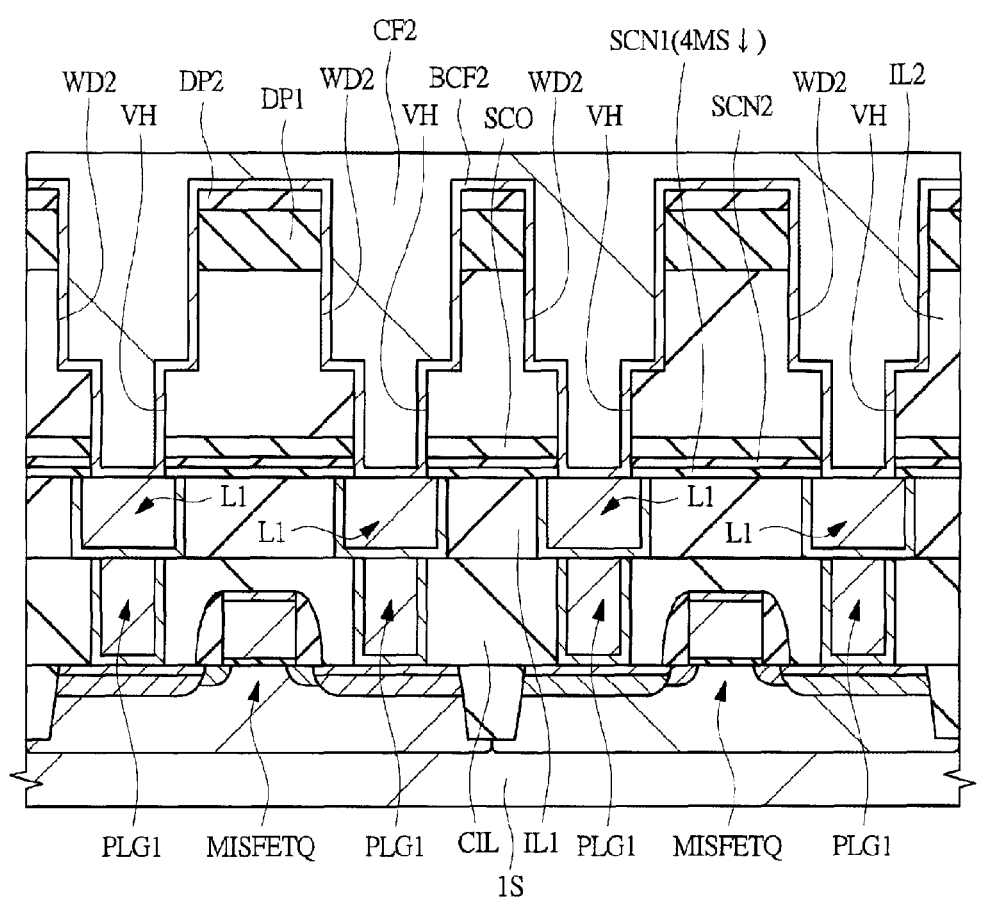
FIG. 28 is a cross-sectional view showing the manufacturing process of the semiconductor device following FIG. 27.

Next, as shown in FIG. 28, a barrier conductor film (a copper diffusion prevention film) BCF2 is formed over the wiring trench WD2, the via hole VH, and the damage protective film DP2. Specifically, the barrier conductor film. BCF2 is constituted from tantalum (Ta), titanium (Ti), ruthenium (Ru), tungsten (W), manganese (Mn) or nitride or nitriding silicide of these materials, or a stacked film of these materials, and is formed using a sputtering method.

Subsequently, over the barrier conductor film BCF2 formed inside the wiring trench WD2 and over the damage protective film DP2, a seed film including a thin copper film is formed by a sputtering method. And, by an electrolytic plating method using the seed film as an electrode, a copper film CF2 is formed. The copper film CF2 is formed to be embedded in the wiring trench WD2. The copper film CF2 is formed from a film including copper as a main constituent. Specifically, it is formed from copper (Cu) or a copper alloy (an alloy of copper (Cu) with aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), lanthanoid-based metal or actinoid-based metal).

Subsequently, unnecessary barrier conductor film BCF2 and copper film CF2 formed over the damage protective film DP2 are removed by a CMP method. At this time, the damage protective film DP2 and the damage protective film DP1 are also removed to form the second layer wiring L2 formed by embedding the barrier conductor film BCF2 and the copper film CF2 in the wiring trench WD2, and the plug PLG2 formed by embedding the barrier conductor film BCF2 and the copper film CF2 in the via hole VH (see FIG. 10). Furthermore, a multilayer wiring is formed at the upper part of the second layer wiring L2, but the explanation is omitted. As described above, the semiconductor device in accordance with Embodiment 1 can be manufactured.

In Embodiment 1, the barrier insulating film is formed from the stacked film of the SiCN film SCN1 (4MS↓), the SiCN film SCN2 and the SiCO film SCO. As described above, the SiCO film SCO has a function as an etching stopper when forming a via hole, and that of controlling the resist poisoning, but, in place of the SiCO film SCO, a silicon oxide film may be used. But, although the silicon oxide film has no water penetration resistance, the SiCO film SCO has water penetration resistance. Thus, using the SiCO film SCO can improve water penetration resistance. Using the SiCN film SCN1 (4MS↓) effectively prevents the penetration of moisture into the first layer wiring L1 lying on the lower side, but the additional use of the SiCO film SCO can further improve water penetration resistance of the barrier insulating film. As a result, the deterioration of electromigration properties in the copper wiring can be controlled effectively.

Moreover, in Embodiment 1, the added thickness of the SiCN film SCN1 (4MS↓) and the SiCN film SCN2 is set to be equal to that of the SiCO film SCO. But, the SiCO film SCO may be thicker than the added thickness of the SiCN film. SCN1 (4MS↓) and the SiCN film SCN2 from the viewpoint of causing the film SCO to exert sufficiently the function as the etching stopper when forming a via hole and the function of controlling the resist poisoning.

Embodiment 2

In Embodiment 1, formation of the SiCN film SCN1 (4MS↓) and the SiCN film SCN2 by a CVD method using tetramethylsilane gas has been explained. In Embodiment 2, application of the invention to a case where the SiCN film is formed by a CVD method using trimethylsilane gas in place of the tetramethylsilane gas will be explained.

Figure 29:
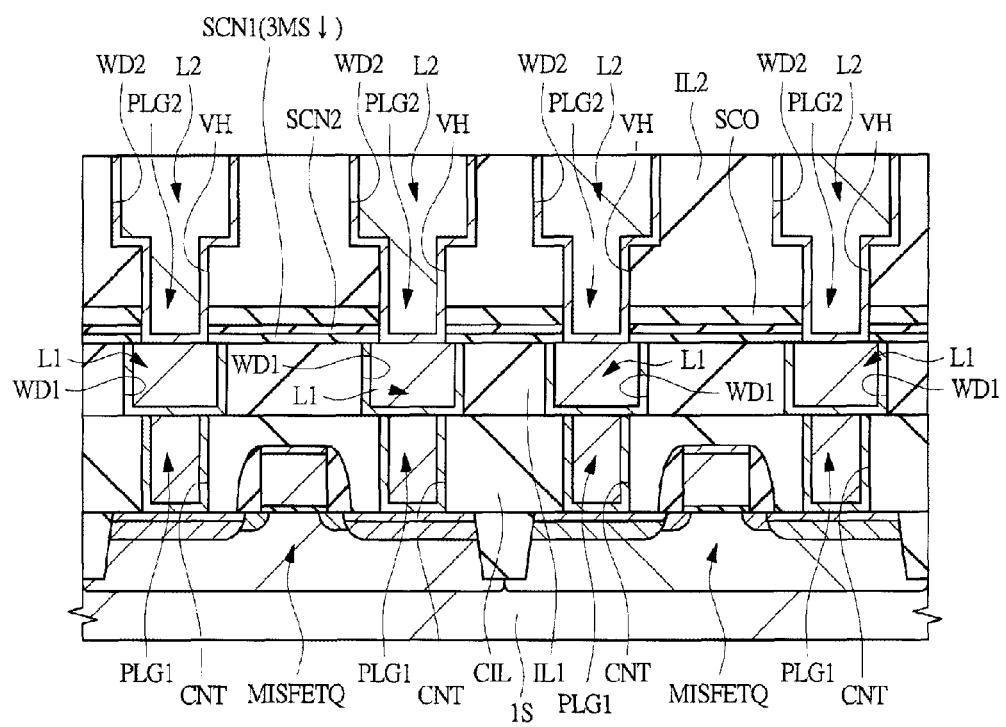
FIG. 29 is a cross-sectional view showing the configuration of the semiconductor device in accordance with Embodiment 2.

FIG. 29 is a cross-sectional view showing the configuration of the semiconductor device in accordance with Embodiment 2. The configuration of the semiconductor device in accordance with Embodiment 2 in FIG. 29 is approximately the same as that of the semiconductor device in accordance with Embodiment 1 in FIG. 10. Thus, a different point will be explained.

In Embodiment 2, the point different from Embodiment 1 is that the SiCN film SCN1 (3MS↓) and the SiCN film SCN2 in FIG. 29 are formed by a CVD method using trimethylsilane gas and ammonia gas as source gases. In Embodiment 1, the SiCN film SCN1 (4MS↓) and the SiCN film SCN2 are formed by a CVD method using tetramethylsilane gas and ammonia gas as source gases, but, in Embodiment 2, the SiCN film SCN1 (3MS↓) and the SiCN film SCN2 are formed by a CVD method using trimethylsilane gas in place of the tetramethylsilane gas.

In Embodiment 2, because the SiCN film SCN1 (3MS↓) is formed under a condition of a trimethylsilane gas flow rate reduced than usual, the content of a methyl group ($CH_3$) contained in the SiCN film SCN1 (3MS↓) is reduced. As a result, in the SiCN film SCN1 (3MS↓) with a reduced content of a methyl group ($CH_3$), the densification of the film can be achieved to provide excellent water penetration resistance. Accordingly, using the SiCN film SCN1 (3MS↓) with a reduced content of a methyl group ($CH_3$) can reduce the moisture passing through the barrier insulating film to reach the copper wiring (the first layer wiring L1). Consequently, the oxidation of the copper wiring due to moisture can be prevented, and, as a result, it is possible to control the lowering of the adherence between the copper wiring and the barrier insulating film and to prevent the deterioration of the electromigration properties of the copper wiring.

The SiCN film SCN2 is formed while setting the trimethylsilane gas flow rate to be a rate under a usual condition. Accordingly, the SiCN film SCN2 contains a larger content of a methyl group (CH3) in the film than the SiCN film SCN1 (3MS↓). Consequently, because the film SCN2 is less densified than the SiCN film SCN1 (3MS↓), it can control the rise of the permittivity. As described above, in Embodiment 2, too, by combining both the SiCN film SCN1 (3MS↓) with a smaller content of a methyl group (CH3) and the SiCN film SCN2 with a larger content of a methyl group (CH3), both the improvement of the water penetration resistance and a low permittivity can be satisfied, in the same manner as in Embodiment 1.

Embodiment 3

In Embodiment 1, formation of the SiCN film SCN (4MS↓) and the SiCN film SCN2 having different contents of a methyl group ($CH_3$) has been explained. In Embodiment 3, a case where a single SiCN film has different contents of a methyl group in the thickness direction will be explained.

Figure 30:
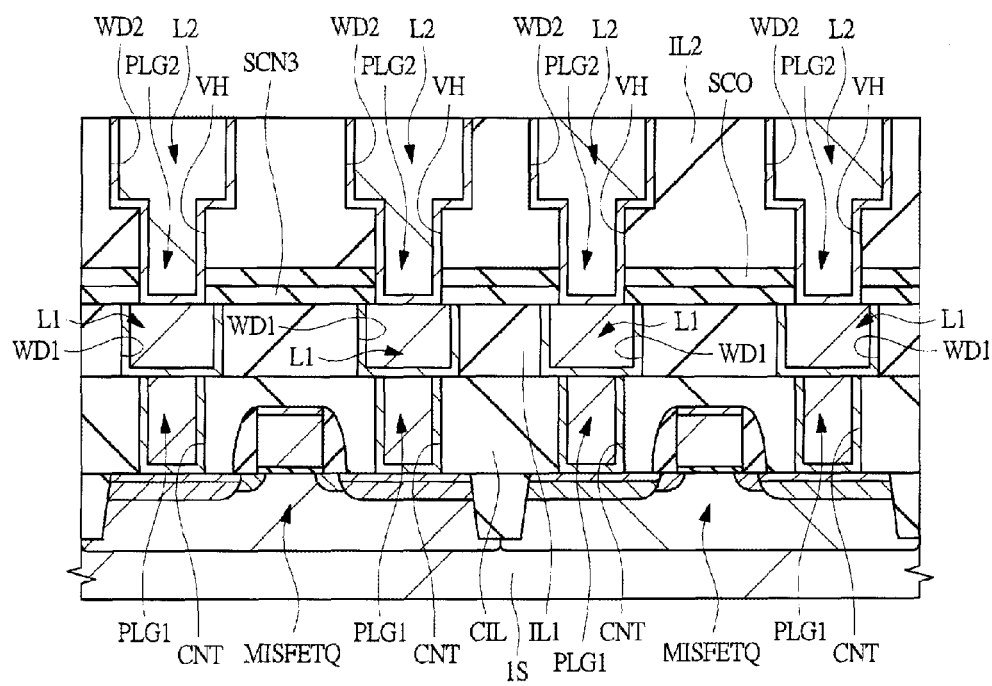
FIG. 30 is a cross-sectional view showing the configuration of the semiconductor device in accordance with Embodiment 3.

FIG. 30 is a cross-sectional view showing the configuration of the semiconductor device in accordance with Embodiment 3. Because the configuration of the semiconductor device in accordance with Embodiment 3 in FIG. 30 is approximately the same as that of the semiconductor device in accordance with Embodiment 1 in FIG. 10, a different point will be described.

In the semiconductor device in accordance with Embodiment 3 in FIG. 30, the barrier insulating film is constituted from a SiCN film SCN3 and the SiCO film SCO formed over the SiCN film SCN3. At that time, the content of a methyl group ($CH_3$) contained in the SiCN film SCN3 is not uniform, and the content of a methyl group ($CH_3$) differs in the film thickness direction. Specifically, in Embodiment 3, from the upper part 3 to the lower part of the SiCN film SCN3, the content of a methyl group ($CH_3$) contained in the SiCN film SCN3 decreases gradually. Accordingly, in the SiCN film SCN3 in accordance with Embodiment 3, since the lower region in the SiCN film SCN3 has a decreased content of a methyl group ($CH_3$) to achieve the densification of the film, the water penetration resistance is excellent. Because the upper region in the SiCN film SCN3 contains a larger content of a methyl group ($CH_3$), the rise of permittivity can be controlled. As described above, in Embodiment 3, by constituting the SiCN film SCN3 having different contents of a methyl group ($CH_3$) in the film thickness direction, both the improvement of the water penetration resistance and a low permittivity can be satisfied.

As the method of forming the SiCN film. SCN3 in Embodiment 3, there is such method that, in a CVD method using tetramethylsilane gas and ammonia gas as source gases, the tetramethylsilane gas flow rate is set to be small at the initial stage of film forming and, after that, as the film forming progresses to the latter stage, the tetramethylsilane gas flow rate is made smaller to form the SiCN film SCN3 to have the content of a methyl group ($CH_3$) increasing continuously as the film forming progresses from the lower part to the upper part in the SiCN film SCN3. Moreover, in place of the tetramethylsilane gas, trimethylsilane gas may be used.

Embodiment 4

In Embodiment 1, formation of the SiCN film SCN2 having a larger content of a methyl group ($CH_3$) over the SiCN film SCN (4MS↓) having a smaller content of a methyl group ($CH_3$) has been explained. In Embodiment 4, formation of the SiCN film SCN (4MS↓) having a smaller content of a methyl group ($CH_3$) over the SiCN film SCN2 having a larger content of a methyl group ($CH_3$) will be explained.

Figure 31:
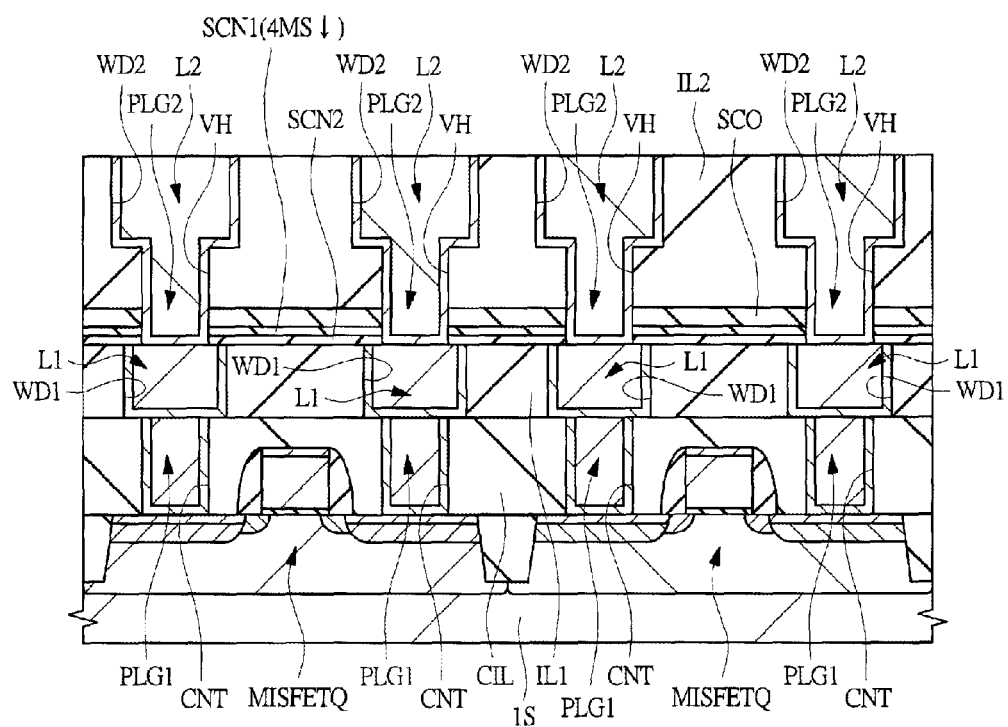
FIG. 31 is a cross-sectional view showing the configuration of the semiconductor device in accordance with Embodiment 4.

FIG. 31 is a cross-sectional view showing the configuration of the semiconductor device in accordance with Embodiment 4. Because the configuration of the semiconductor device in accordance with Embodiment 4 in FIG. 31 is approximately the same as that of the semiconductor device in accordance with Embodiment 1 in FIG. 10, a different point will be explained.

In the semiconductor device in accordance with Embodiment 4 in FIG. 31, contrary to the embodiment 1 shown in FIG. 10, the SiCN film. SCN (4MS↓) having a smaller content of a methyl group ($CH_3$) is formed over the SiCN film SCN2 having a larger content of a methyl group ($CH_3$). Even when such configuration is adopted, in the same manner as in Embodiment 1, the combination of both the SiCN film SCN1 (4MS↓) having a smaller content of a methyl group ($CH_3$) and the SiCN film SCN2 having a larger content of a methyl group ($CH_3$) makes it possible to satisfy both the improvement of water penetration resistance and a low permittivity.

In particular, Embodiment 4 can also give an effect shown below. In Embodiment 4, because the SiCN film SCN1 (4MS↓) having a smaller content of a methyl group ($CH_3$) does not directly contact the first layer wiring L1, stress migration properties of the first layer wiring L1 can be improved. Because the SiCN film SCN1 (4MS↓) having a smaller content of a methyl group ($CH_3$) is densified, the modulus of elasticity is also improved (made harder). This acts in a direction of improving the electromigration properties of the first layer wiring L1, but in contrast, if the SiCN film SCN1 (4MS↓) contacts directly the first layer wiring L1, the difference in stresses between the SiCN film. SCN1 (4MS↓) and the first layer wiring L1 deteriorates the stress migration properties. As in Embodiment 4, when the configuration in which the SiCN film SCN1 (4MS↓) having a smaller content of a methyl group ($CH_3$) does not directly contact the first layer wiring L1 is adopted, the deterioration of stress migration properties can be alleviated. In accordance with Embodiment 4, the use of the SiCN film SCN1 (4MS↓) having a smaller content of a methyl group ($CH_3$) improves the water penetration resistance to make it possible to improve the electromigration properties, and to also control the deterioration of the stress migration properties because the SiCN film SCN1 (4MS↓) having a smaller content of a methyl group (CH$_3$) does not directly contact the first layer wiring L1.

Figure 32:
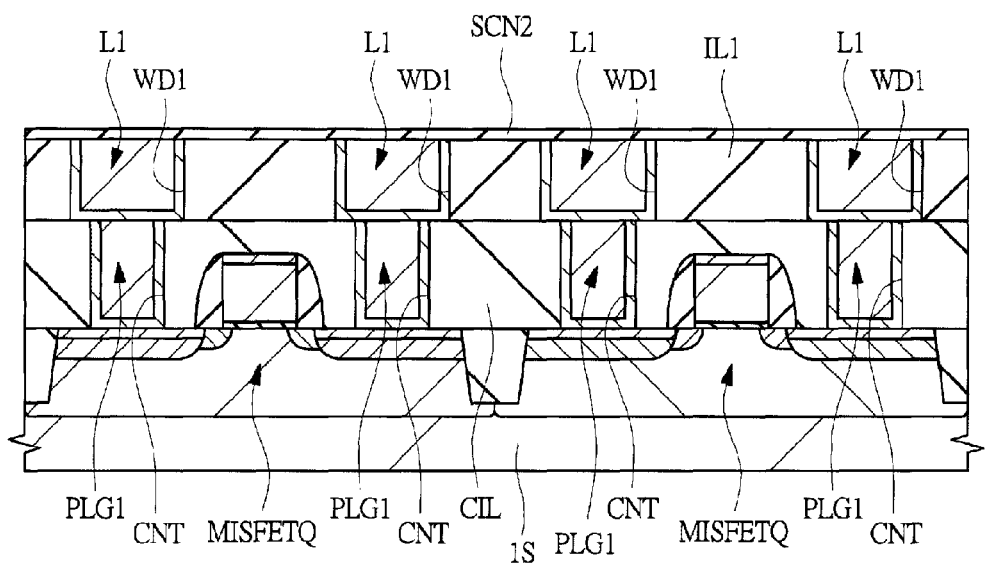
FIG. 32 is a cross-sectional view showing the manufacturing process of the semiconductor device in accordance with Embodiment 4.
Figure 33:
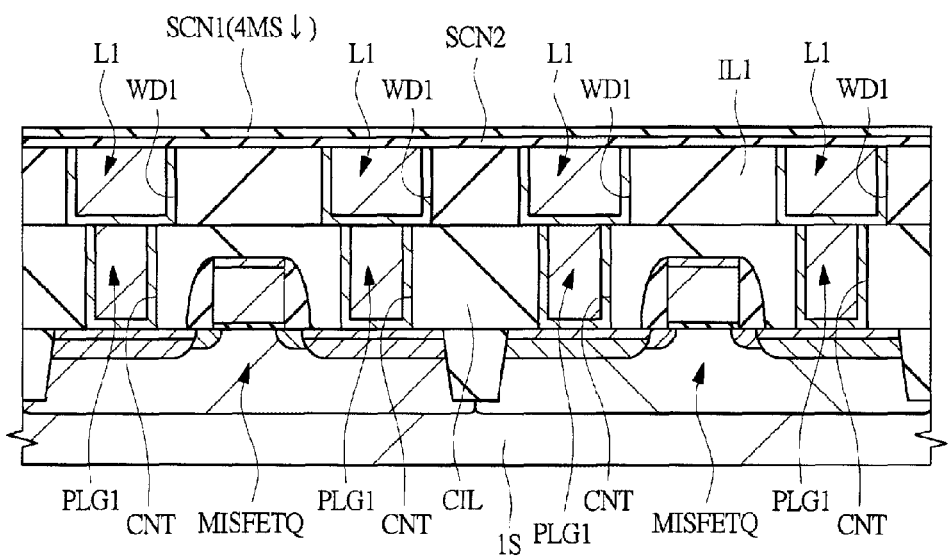
FIG. 33 is a cross-sectional view showing the manufacturing process of the semiconductor device following FIG. 32.

The method of manufacturing a semiconductor device in Embodiment 4 is approximately the same as that of manufacturing a semiconductor device in Embodiment 1. After the processes from FIG. 11 to FIG. 18, as shown in FIG. 32, the SiCN film SCN2 having a larger content of a methyl group (CH$_3$) is formed by a CVD method under a condition set to have a usual tetramethylsilane gas flow rate. After that, as shown in FIG. 33, the SiCN film SCN1 (4MS↓) having a content of a methyl group (CH$_3$) smaller than the SiCN film SCN2 is formed by a CVD method under a condition set to have a tetramethylsilane gas flow rate smaller than usual. After that, by going through processes shown from FIG. 21 to FIG. 28, the semiconductor device in accordance with Embodiment 4 can be manufactured.

Embodiment 5

In Embodiment 4, formation of the SiCN film SCN1 (4MS↓) and the SiCN film SCN2 by a CVD method using tetramethylsilane gas has been explained. In Embodiment 5, application of the invention to a case where a SiCN film is formed by a CVD method using trimethylsilane gas in place of tetramethylsilane gas will be explained.

Figure 34:
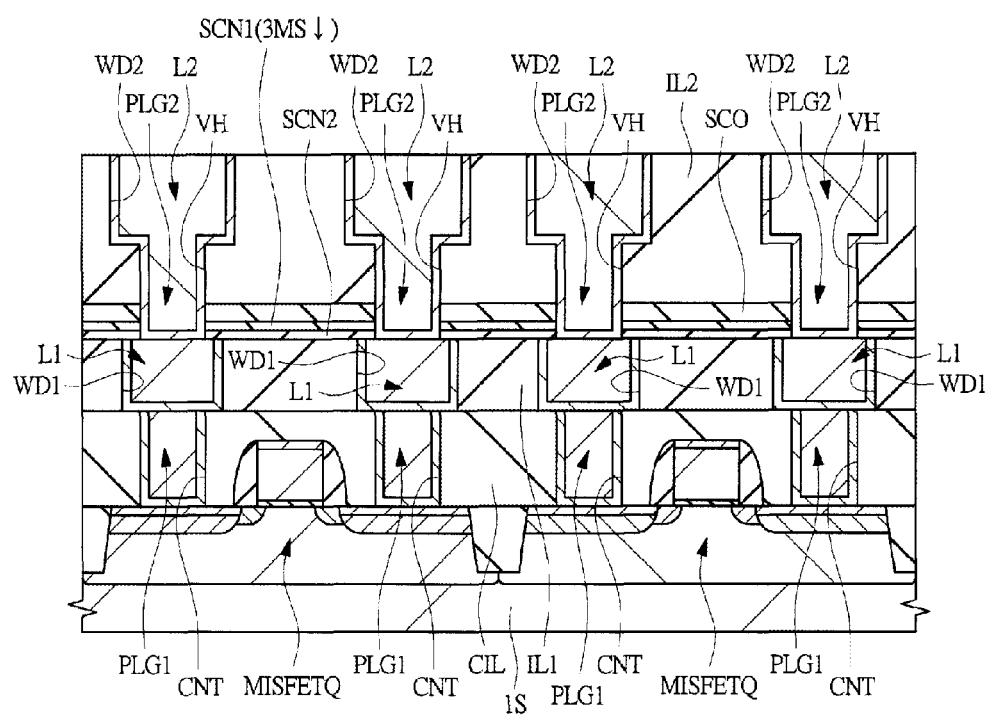
FIG. 34 is a cross-sectional view showing the configuration of the semiconductor device in accordance with Embodiment 5.

FIG. 34 is a cross-sectional view showing the configuration of the semiconductor device in accordance with Embodiment 5. Because the configuration of the semiconductor device in accordance with Embodiment 5 in FIG. 34 is approximately the same as that of the semiconductor device in accordance with Embodiment 4 in FIG. 31, a different point will be explained.

In Embodiment 5, a different point from the embodiment 4 is that the SiCN film SCN1 (3MS↓) and the SiCN film SCN2 shown in FIG. 34 are formed by a CVD method using trimethylsilane gas and ammonia gas as source gases.

In such embodiment 5, the SiCN film SCN2 is formed by setting the trimethylsilane gas flow rate to be under a usual condition. Accordingly, the SiCN film SCN2 has a content of a methyl group (CH$_3$) contained in the film larger than the SiCN film SCN1 (3MS↓). Consequently, because the film is less densified than the SiCN film SCN1 (3MS↓), the rise of permittivity can be controlled.

Because the SiCN film SCN1 (3MS↓) is formed under a condition in which the flow rate of trimethylsilane gas is set to be smaller than usual, the SiCN film SCN1 (3MS↓) contains a methyl group (CH$_3$) in a smaller content. As a result, in the SiCN film SCN1 (3MS↓) with a smaller content of a methyl group (CH$_3$), since the densification of the film can be achieved, the film is excellent in water penetration resistance. Accordingly, by using the SiCN film SCN1 (3MS↓) having a smaller content of a methyl group (CH$_3$) as the barrier insulating film, moisture reaching the copper wiring (the first layer wiring L1) while passing through the barrier insulating film can be made smaller. Consequently, as the result of being capable of preventing the oxidation of the copper wiring by moisture, it is possible to suppress the lowering of the adherence between the copper wiring and the barrier insulating film, and to prevent the deterioration of the electromigration properties of the copper wiring.

As described above, Embodiment 5 can satisfy both the improvement of the water penetration resistance and the low permittivity by combining both the SiCN film SCN1 (3MS↓) having a smaller content of a methyl group (CH$_3$) and the SiCN film SCN2 having a larger content of a methyl group (CH$_3$), in the same manner as in Embodiment 4.

Embodiment 6

In the embodiment 4, formation of the SiCN film SCN2 and the SiCN film SCN (4MS↓) having different contents of a methyl group (CH$_3$) has been explained. In Embodiment 6, a single SiCN film having different contents of a methyl group in the thickness direction will be explained.

Figure 35:
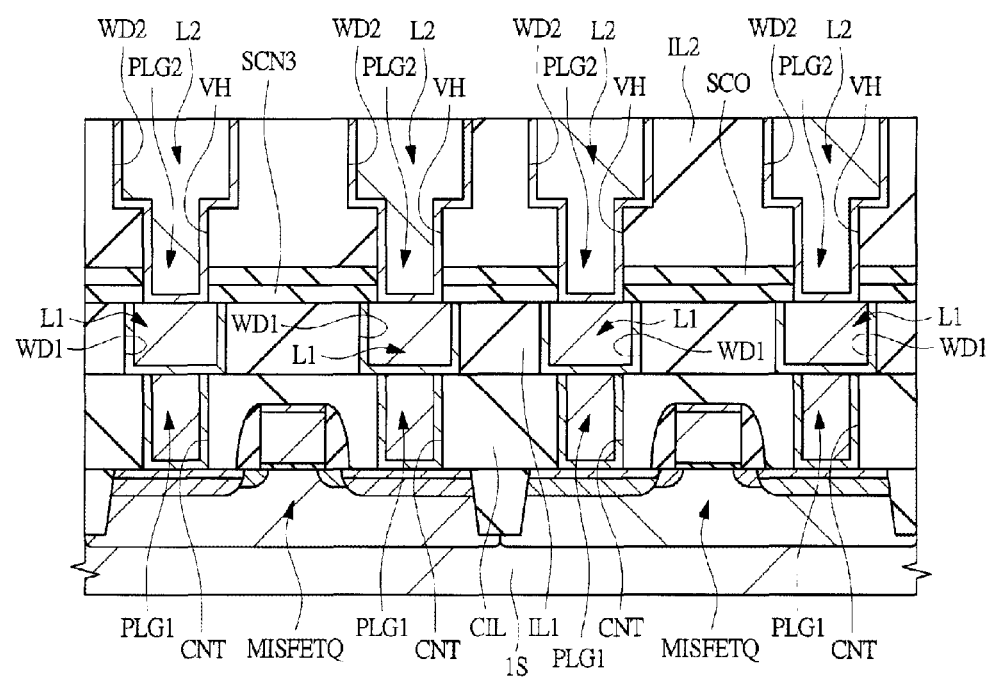
FIG. 35 is a cross-sectional view showing the configuration of the semiconductor device in accordance with Embodiment 6.

FIG. 35 is a cross-sectional view showing the configuration of the semiconductor device in accordance with Embodiment 6. Because the configuration of the semiconductor device in accordance with Embodiment 6 in FIG. 35 is approximately the same as that of the semiconductor device in accordance with Embodiment 4 in FIG. 31, a different point will be explained.

In the semiconductor device in accordance with Embodiment 6 in FIG. 35, the barrier insulating film is constituted from the SiCN film SCN3 and the SiCO film SCO formed over the SiCN film SCN3. At this time, the content of a methyl group (CH$_3$) contained in the SiCN film SCN3 is not uniform, and the content of a methyl group (CH$_3$) is different in the film thickness direction. Specifically, in Embodiment 6, from the upper part 3 to the lower part of the SiCN film SCN3, the content of a methyl group (CH$_3$) contained in the SiCN film SCN3 increases gradually. Accordingly, in the SiCN film SCN3 in accordance with Embodiment 6, because the upper region in the SiCN film SCN3 has a smaller content of a methyl group (CH$_3$), the densification of the film is achieved and the film is excellent in water penetration resistance. In the lower region in the SiCN film. SCN3, because the content of a methyl group (CH$_3$) becomes larger, the rise of the permittivity can be suppressed. As described above, in Embodiment 6, by constituting the SiCN film SCN3 having different contents of a methyl group (CH$_3$) in the thickness direction, both the improvement of the water penetration resistance and the low permittivity can be satisfied.

As the method of forming the SiCN film. SCN3 in accordance with Embodiment 6, there is such method that, in a CVD method using tetramethylsilane gas and ammonia gas as source gases, the tetramethylsilane gas flow rate is set to be large at the initial stage of film forming and, after that, as the film forming progresses to the latter stage, the tetramethylsilane gas flow rate is made smaller to form the SiCN film SCN3 so as to have the content of a methyl group (CH$_3$) decreasing continuously as the film forming progresses from the lower part to the upper part in the SiCN film SCN3. Moreover, in place of the tetramethylsilane gas, trimethylsilane gas may be used.

The invention achieved by the inventor is explained specifically based on the embodiments, but the invention is not limited to the embodiments, and can be changed variously in the range that does not depart form the purport.

The invention can broadly be used in manufacturing industries of manufacturing semiconductor devices.

What is claimed is:

1. A method of manufacturing a semiconductor device, comprising the steps of:
    (a) forming a first interlayer insulating film over a semiconductor substrate;
    (b) after the step (a), forming a first wiring trench for the first interlayer insulating film;
    (c) after the step (b), forming a first wiring for the first wiring trench;

(d) after the step (c), forming a first SiCN film by a CVD method using a first source gas containing a methyl group over the first interlayer insulating film over which the first wiring is formed;
(e) after the step (d), forming a second SiCN film by a CVD method using the first source gas containing a methyl group over the first SiCN film;
(f) after the step (e), forming a first insulating film including a SiCO film or a silicon oxide film over the second SiCN film; and
(g) after the step (f), forming a wiring layer including a second interlayer insulating film and a second wiring formed in the second interlayer insulating film, over the first insulating film, wherein:
the first interlayer insulating film and the second interlayer insulating film are low permittivity films; and
a flow rate of the first source gas used in the step (d) differs from that of the first source gas used in the step (e), wherein the step (g) comprises
  (g1) after the step (f), forming the second interlayer insulating film over the first insulating film;
  (g2) after the step (g1), forming a first damage protective film over the second interlayer insulating film;
  (g3) after the step (g2), forming a second damage protective film over the first damage protective film;
  (g4) after the step (g3), forming a first chemically amplified resist film over the second damage protective film;
  (g5) after the step (g4), patterning the first chemically amplified resist film;
  (g6) after the step (g5), etching the second damage protective film, the first damage protective film, and the second interlayer insulating film by using the patterned first chemically amplified resist film as a mask, to form a via hole exposing the first insulating film at a bottom part;
  (g7) after the step (g6), removing the first chemically amplified resist film and forming a second chemically amplified resist film over the second damage protective film;
  (g8) after the step (g7), patterning the second chemically amplified resist film;
  (g9) after the step (g8), patterning the second damage protective film by using the patterned second chemically amplified resist film as a mask;
  (g10) after the step (g9), by etching using the patterned second damage protective film as a mask, forming a second wiring trench for the first damage protective film and the second interlayer insulating film, and, at the same time, removing the first insulating film, the second SiCN film, and the first SiCN film from a bottom part of the via hole to expose the first wiring;
  (g11) after the step (g10), forming a second conductor film inside the second wiring trench, inside the via hole, and over the second damage protective film; and
  (g12) after the step (g11), removing, by a CMP method, the second conductor film formed over the second damage protective film while leaving the second conductor film inside the second wiring trench and inside the via hole to form the second wiring embedded in the second wiring trench and a plug embedded in the via hole.

2. The method of manufacturing a semiconductor device according to claim 1, further comprising, between the step (g9) and the step (g10), the step of removing the second chemically amplified resist film.

3. The method of manufacturing a semiconductor device according to claim 1,
wherein the flow rate of the first source gas used in the step (d) is smaller than that of the first source gas used in the step (e).

4. The method of manufacturing a semiconductor device according to claim 1,
wherein the flow rate of the first source gas used in the step (d) is larger than that of the first source gas used in the step (e).

5. The method of manufacturing a semiconductor device according to claim 1,
wherein the first source gas contains tetramethylsilane gas.

6. The method of manufacturing a semiconductor device according to claim 1,
wherein the first source gas contains trimethylsilane gas.

7. The method of manufacturing a semiconductor device according to claim 1, wherein the step (c) comprises the steps of:
  (c1) forming a first conductor film over the first interlayer insulating film including the inside of the first wiring trench; and
  (c2) removing, by a CMP method, the first conductor film formed over the first interlayer insulating film while leaving the first conductor film inside the first wiring trench to form the first wiring embedded in the first wiring trench.

* * * * *